United States Patent
Abe et al.

(10) Patent No.: US 9,536,957 B2
(45) Date of Patent: Jan. 3, 2017

(54) P-TYPE OXIDE, COMPOSITION FOR PRODUCING P-TYPE OXIDE, METHOD FOR PRODUCING P-TYPE OXIDE, SEMICONDUCTOR ELEMENT, DISPLAY ELEMENT, IMAGE DISPLAY DEVICE, AND SYSTEM

(71) Applicants: Yukiko Abe, Kanagawa (JP); Naoyuki Ueda, Kanagawa (JP); Yuki Nakamura, Tokyo (JP); Mikiko Takada, Kanagawa (JP); Shinji Matsumoto, Kanagawa (JP); Yuji Sone, Kanagawa (JP); Ryoichi Saotome, Kanagawa (JP)

(72) Inventors: Yukiko Abe, Kanagawa (JP); Naoyuki Ueda, Kanagawa (JP); Yuki Nakamura, Tokyo (JP); Mikiko Takada, Kanagawa (JP); Shinji Matsumoto, Kanagawa (JP); Yuji Sone, Kanagawa (JP); Ryoichi Saotome, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/360,791

(22) PCT Filed: Nov. 28, 2012

(86) PCT No.: PCT/JP2012/081429
§ 371 (c)(1),
(2) Date: May 27, 2014

(87) PCT Pub. No.: WO2013/081169
PCT Pub. Date: Jun. 6, 2013

(65) Prior Publication Data
US 2014/0353648 A1 Dec. 4, 2014

(30) Foreign Application Priority Data

Nov. 30, 2011 (JP) .................................. 2011-261845
Mar. 15, 2012 (JP) .................................. 2012-058668

(51) Int. Cl.
*H01L 29/24* (2006.01)
*C01G 30/00* (2006.01)
(Continued)

(52) U.S. Cl.
CPC ............. *H01L 29/247* (2013.01); *C01G 19/00* (2013.01); *C01G 30/00* (2013.01); *G02F 1/1368* (2013.01);
(Continued)

(58) Field of Classification Search
CPC ............. H01L 29/247; H01L 21/02422; H01L 21/02483; H01L 21/02565; H01L 21/02576; H01L 21/02579; H01L 21/02628; H01L 21/02631; H01L 29/7869; H01L 29/78693; H01L 29/861; C01G 19/00; C01G 30/00; C01P 2002/72; G02F 1/1368
See application file for complete search history.

(56) References Cited

U.S. PATENT DOCUMENTS 6,294,274 B1    9/2001  Kawazoe et al.
7,521,716 B2 *  4/2009  Ando .................. H01L 27/1292
                                                      257/347
(Continued)

FOREIGN PATENT DOCUMENTS

JP    11-278834      10/1999
JP    2000-150861     5/2000
(Continued)

OTHER PUBLICATIONS

International Search Report Issued for counterpart International Patent Application No. PCT/JP2012/081429 dated Mar. 5, 2013.
(Continued)

Primary Examiner — Roy Potter
Assistant Examiner — Paul Patton
(74) Attorney, Agent, or Firm — Cooper & Dunham LLP

(57) ABSTRACT

To provide is a p-type oxide, including an oxide, wherein the oxide includes: Cu; and an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and wherein the p-type oxide is amorphous.

11 Claims, 20 Drawing Sheets

(51) Int. Cl.

| | | |
|---|---|---|
| H01L 21/02 | (2006.01) | |
| H01L 29/861 | (2006.01) | |
| C01G 19/00 | (2006.01) | |
| H01L 29/786 | (2006.01) | |
| G02F 1/1368 | (2006.01) | |
| H01L 27/12 | (2006.01) | |
| H01L 27/32 | (2006.01) | |

(52) U.S. Cl.
CPC ... *H01L 21/02422* (2013.01); *H01L 21/02483* (2013.01); *H01L 21/02565* (2013.01); *H01L 21/02576* (2013.01); *H01L 21/02579* (2013.01); *H01L 21/02623* (2013.01); *H01L 21/02628* (2013.01); *H01L 21/02631* (2013.01); *H01L 27/124* (2013.01); *H01L 27/1225* (2013.01); *H01L 27/3244* (2013.01); *H01L 29/7869* (2013.01); *H01L 29/78693* (2013.01); *H01L 29/861* (2013.01); *C01P 2002/72* (2013.01)

(56) References Cited

U.S. PATENT DOCUMENTS

| | | |
|---|---|---|
| 2005/0133917 A1 | 6/2005 | Hoffman et al. |
| 2007/0054042 A1 | 3/2007 | Zhuang et al. |
| 2011/0253997 A1* | 10/2011 | Park .......................... C23C 14/08 257/43 |

FOREIGN PATENT DOCUMENTS

| | | |
|---|---|---|
| JP | 2000-228516 | 8/2000 |
| JP | 2005-183984 | 7/2005 |
| JP | 2006-165532 | 6/2006 |
| JP | 2007-073936 | 3/2007 |
| JP | 2010-287811 | 12/2010 |
| WO | WO2010/010802 | 1/2010 |
| WO | WO2013/122084 A1 | 8/2013 |

OTHER PUBLICATIONS

J. Bloem, Discussion of some optical and electrical properties of $Cu_2O$, Philips Research Reports, vol. 13, 1958, pp. 167-193.

H. Kawazoe and 5 others, P-type electrical conduction in transparent thin films of $CuAlO_2$, Nature, vol. 389, 1997, pp. 939-942.

H. Yanagi and 4 others, Bipolarity in electrical conduction of transparent oxide semiconductor $CuInO_2$ with delafossite structure, Applied Physics Letters, vol. 78, 2001, pp. 1583-1585.

A. Kudo and 3 others, $SrCu_2O_2$: A p-type conductive oxide with wide band gap, Applied Physics Letters, vol. 73, 1998, pp. 220-222.

E. Fortunato and 8 others, Thin-film transistors based on p-type $Cu_2O$ thin films produced at room temperature, Applied Physics Letters, vol. 96, 2010, pp. 192102.

K. Matsuzaki and 5 others, Epitaxial growth of high mobility $Cu_2O$ thin films and application to p-channel thin film transistor, Applied Physics Letters, vol. 93, 2008, pp. 202107.

C.W.Ou, et al., Anomalous p-channel amorphous oxide transistors based on tin oxide and their complementary circuits, Applied Physics Letters, 2008, vol. 92, art. 122113.

M. Singh, et al., Effect of pH on structural and morphological properties of spray deposited p-type transparent conducting oxide $CuAlO_2$ thin films, Materials Letters, 2008, vol. 62, pp. 3613-3616.

M. Nolan and S.D.Elliott, Tuning the transparency of $Cu_2O$ with substitutional cation doping, Chemistry of Materials, 2008, vol. 20, pp. 5522-5531.

H.Ohta and H.Hosono, Transparent oxide optoelectronics, Materials Today, Jun. 2004, vol. 7, No. 6, pp. 42-51.

European search report dated Jun. 5, 2015 in corresponding European Patent Application No. 12852639.9.

* cited by examiner

US 9,536,957 B2

P-TYPE OXIDE, COMPOSITION FOR PRODUCING P-TYPE OXIDE, METHOD FOR PRODUCING P-TYPE OXIDE, SEMICONDUCTOR ELEMENT, DISPLAY ELEMENT, IMAGE DISPLAY DEVICE, AND SYSTEM

TECHNICAL FIELD

The present invention relates to a p-type oxide, a composition for producing the same, a method for producing the same, a semiconductor element, a display element, an image display device, and a system.

BACKGROUND ART

Since an announcement of an $InGaZnO_4$ (a-IGZO) thin film transistor (TFT) that exhibits the mobility of a-Si or higher in the amorphous state, researches and developments of oxide semiconductors for practical use have been energetically conducted in all over the world. Most of these oxide semiconductor materials are however n-type oxide semiconductors using electrons as carrier.

If a p-type oxide semiconductor that is comparative to the n-type oxide semiconductor can be utilized on practice, these p-type oxide semiconductor and n-type oxide semiconductor are combined to form p-n junction, to thereby realize a diode, an optical sensor, a solar battery, a LED, or a bipolar transistor. It is also possible to make these devices transparent, as the oxide semiconductor can be designed to have a wide-band gap.

Moreover, an active-matrix display uses, as a basic driving circuit, a 2T1C circuit, as illustrated in FIG. 7. In such display, if a driving transistor (field-effect transistor 20) is n-type, the driving circuit is so called source follower circuit. Therefore, the operating point of the driving transistor is sifted to the operating point of the different gate voltage due to aging (especially increasing in voltage) of the properties of the organic EL element, to thereby shorten half-life of the display. For this reason, it has not yet realized an active-matrix organic EL display (AM-OLED) using a-IGZO TFT of high mobility as a backplane, p-type low temperature polysilicon thin film transistors (LTPS-TFT) have been exclusively employed. Therefore, there is a need for a p-type oxide semiconductor of high performance.

It has been known since 1950s that a $Cu_2O$ crystal that is a monovalent copper oxide exhibits p-type conductivity (see, for example NPL 1). This crystal has a dumbbell structure of O—Cu—O as a base, and the hybrid orbital of the 3d-orbital of Cu and 2p-orbital of oxygen constitutes a top of a valence band. Holes are introduced into the valence band by oxygen excess stoicheimetry, to thereby exhibit p-type conductivity.

Examples of the crystal having the dumbbell structure as a base unit include a delafossite crystal represented by $CuMO_2$ (M=Al, Ga, In), and $SrCu_2O_2$ crystal. In order for these oxides to exhibit p-type electric conductivity, they need to have high crystallinity, and only crystals, p-type conductivity of which has been reported, are $CuAlO_2$, $CuInO_2$, and $SrCu_2O_2$ (see, for example, NPL 2 to NPL 4).

One of the reasons why it is difficult to exhibits p-type conductivity is that the valency of Cu and oxygen content are difficult to control. When it is attempt to form a single phase film of oxide containing highly crystalline $Cu^+$, a resulting film is, in most cases, a film in which a crystal phase containing $Cu^{2+}$, such as $CuO$, $SrCuO_2$, and $SrCu_2O_3$ is mixed. With such film, excellent p-type electric conductivity cannot be attained, and it is difficult to control properties thereof. Accordingly, when these p-type oxide materials are used as an active layer of a semiconductor element, properties, such as carrier density and carrier mobility, cannot be optimized.

Other than above, disclosed is delafossite oxide containing monovalent Cu or Ag (for example, see PTL 1). However, in the disclosed technique, a heat treatment of high temperature, 500° C. or higher, is necessary and therefore it is not suitable for practical use.

Moreover, disclosed is a p-type electric conductive thin film of crystalline $SrCu_2O_2$ (for example, see PTL 2). In the disclosed technique, the thin film forming temperature is relatively low, i.e., 300° C., but sufficient electric conductivity has not been attained, and the best conductivity attained is $4.8 \times 10^{-2}$ $Scm^{-1}$. Further, control thereof is also insufficient.

As described above, these disclosed techniques have a problem that a p-type oxide material cannot be produced by a practical method, and a p-type oxide that has appropriately controlled and sufficient electric conductivity cannot be provided.

Moreover, disclosed is a TFT using, as an active layer, a p-type oxide material delafossite crystal containing monovalent Cu or Ag for example, see PTL 3).

However, this literature does not disclose sufficient information, such as properties of a material of the active layer, a formation method thereof, and properties of the transistor.

Further, disclosed is a TFT using a $Cu_2O$ crystal as an active layer (see, for example, NPL 5 and NPL 6). In accordance these techniques, however, properties of the active layer cannot be sufficiently controlled, and therefore the electron field-effect mobility and on-off ratio of the TFT have not reached the levels suitable for practical use.

As described above, these disclosed techniques have problems that it is difficult to control properties of the p-type oxide material, such as carrier density, and the properties suitable for use in a device cannot be attained.

So far, it has not yet been discovered a p-type oxide that is effective in practical use.

Accordingly, there is currently a need for a p-type oxide having characteristics that are comparative to characteristics of an n-type oxide.

CITATION LIST

Patent Literature

PTL 1: Japanese Patent Application Laid-Open (JP-A) No. 11-278834
PTL 2: JP-A No. 2000-150861
PTL 3: JP-A No. 2005-183984

Non-Patent Literature

NPL 1: J. Bloem, Discussion of some optical and electrical properties of $Cu_2O$, Philips Research Reports, VOL 13, 1958, pp. 167-193
NPL 2: H. Kawazoe and 5 others, P-type electrical conduction in transparent thin films of $CuAlO_2$, Nature, VOL. 389, 1997, pp. 939-942
NPL 3: H. Yanagi and 4 others, Bipolarity in electrical conduction of transparent oxide semiconductor $CuInO_2$ with delafossite structure, Applied Physics Letters, VOL. 78, 2001, pp. 1583-1585

NPL 4: A. Kudo and 3 others, SrCu$_2$O$_2$: A p-type conductive oxide with wide band gap, Applied Physics Letters, VOL. 73, 1998, pp. 220-222

NPL 5: E. Fortunato and 8 others, Thin-film transistors based on p-type Cu$_2$O thin films produced at room temperature, Applied Physics Letters, VOL. 96, 2010, pp. 192102

NPL 6: K. Matsuzaki and 5 others, Epitaxial growth of high mobility Cu$_2$O thin films and application to p-channel thin film transistor, Applied Physics Letters, VOL, 93, 2008, pp. 202107

SUMMARY OF INVENTION

Technical Problem

The present invention aims to provide the aforementioned various problems in the conventional art, and to achieve the following object. Specifically, an object of the present invention is to provide a novel p-type oxide, which has excellent properties, i.e., sufficient electric conductivity, which can be produced under practical conditions, that is at relative low temperature, and which can control electric conductivity by adjusting a formulation ratio.

Solution to Problem

The means for solving the aforementioned problems are as follows:

A p-type oxide, including:
an oxide,
wherein the oxide includes:
Cu; and
an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
wherein the p-type oxide is amorphous.

Advantageous Effects of Invention

The present invention can solve the various problems in the art, and provide a novel p-type oxide, which has excellent properties, i.e., sufficient electric conductivity, which can be produced under practical conditions, that is at relative low temperature, and which can control electric conductivity by adjusting a formulation ratio.

Figure 1:
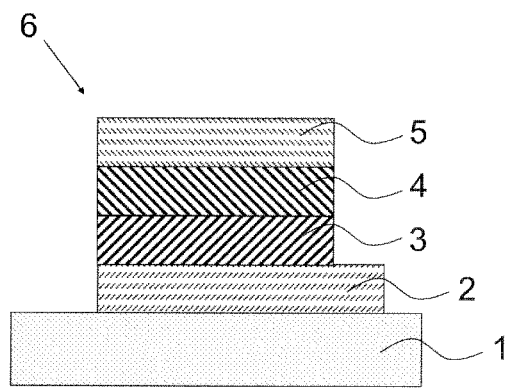
FIG. 1 is a schematic structure diagram illustrating one example of a diode.

DESCRIPTION OF EMBODIMENTS (P-Type Oxide, Composition for Producing P-Type Oxide, and Method for Producing P-Type Oxide)

<P-Type Oxide>

A p-type oxide of the present invention essentially consists of an oxide containing Cu, and element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and wherein the p-type oxide is amorphous.

In the descriptions below, the element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, may be referred to merely as "element M."

The p-type oxide is amorphous, and exhibits p-type electric conductivity that uses holes as carrier.

In monovalent copper for silver)oxide utilizing the valence band consisting of the hybrid orbital of the 3d-orbital of Cu and 2p-orbital of O, anisotropy of the electron orbital is strong, and therefore it is conventionally believed that the copper oxide needs to be crystals to exhibit p-type. This is completely different from an n-type oxide semiconductor, which utilizes a conduction band consisting of isotropic s-orbital of heavy metal. However, the present inventors have found that a certain Cu oxide in the amorphous state exhibit p-type conductivity.

Since the p-type oxide is amorphous, a ratio of Cu-containing oxide and the element M-containing oxide can be continuously adjusted. The electric conductivity of the oxide can be controlled by the aforementioned ratio, and as a result, p-type oxide of desirable properties suited for an intended purpose can be obtained.

It is difficult to control a valency of Cu and an oxygen content in a conventional crystalline p-type oxide containing monovalent copper, and therefore it is difficult to form a single phase film with the conventional p-type oxide. Moreover, the presence of a phase containing an unintentionally generated $Cu^{2+}$ interferes p-type electric conductivity.

The p-type oxide of the present invention essentially consists of an oxide containing Cu, and the element M. The element M is an element that can be an equilibrium state where there are both a state where all electrons of p-orbital of an outer shell are lost (this state is represented as $M^{x+}$) and a state where two electrons are released and all of the electrons of s-orbital and p-orbital of the outermost shell are lost (this state is presented as $M^{(x+2)+}$ by increasing the valency by 2), as presented as an ion. The p-type oxide of the present invention essentially consists of an oxide containing Cu and the element M, and an electron released when $M^{x+}$ is transformed to $M^{(x+2)+}$ is incorporated into $Cu^{2+}$ to become $Cu^+$. As a result of this change of the state, Cu can stably exist as $Cu^+$ rather than $Cu^{2+}$.

For example, one example of the element M is Sn. Sn has an effect of improving p-type electric conductive property in the p-type oxide as it releases two electrons during the transition from the state of $Sn^{2+}$ where two 5p electron of the outermost shell are lost, to the state of $Sn^{4+}$, where two 5s electrons and two 5p electrons are lost, so that Cu stably exists as $Cu^+$ rather than $Cu^{2+}$.

Moreover, another example of the element M is Sb. Sb has an effect of improving p-type electric conductive property in the p-type oxide as it releases two electrons during the transition from the state of $Sb^{3+}$, where three 5p electrons of the outermost shell are lost, to the state of $Sb^{5+}$, where two 5s electrons and three 5p electrons are lost, so that Cu stably exists as $Cu^+$ rather than $Cu^{2+}$.

Moreover, comparing that a conventional p-type oxide containing Cu is crystalline, the p-type oxide of the present invention is amorphous, and therefore the p-type oxide of the present invention has an advantage that it can form a uniform film without causing variation in properties thereof due to variation in crystallinity.

Note that, the p-type oxide is an amorphous oxide essentially consisting of an oxide containing Cu and oxide containing the element M, but the p-type oxide may contain a trace of crystalline particles, which hardly affect semiconductor characteristics. Such p-type oxide containing a trace of crystals is included in the scope of the p-type oxide of the present invention. Here, trace means, for example, an amount with which percolation of crystal particles does not occur, and means about 15% by volume or lower.

The electric properties of the p-type oxide depend on a ratio of the Cu-containing oxide and the element M-containing oxide. The p-type oxide can be used for various semiconductor elements, but properties (resistance) required for the semiconductor in the element are typically varied depending on types or characteristics of a semiconductor element. Accordingly, the composition (e.g., a value of the molar ratio of Cu and the element M in the film) can be appropriately selected depending on the intended purpose.

The element M is appropriately selected depending on the intended purpose without any limitation, provided that it is an element selected from p-block elements, and an element that can take an equilibrium state, in which there are both a state where all of electrons of p-orbital of an outermost shell are lost and a state where all of electrons on the outermost shell are lost, as presented as an ion. Examples of the element M include Sn, Sb, Te, Tl, and Pb.

A shape of the p-type oxide is appropriately selected depending on the intended purpose without any limitation, and examples thereof include a film, and bulks (particles).

The p-type oxide is effective as a p-type active layer of a semiconductor element, such as a pn-junction diode, a PIN photodiode, a field-effect transistor, a light emitting element, and a photoelectric transducer.

The method for producing a p-type oxide is preferably the method for producing a p-type oxide of the present invention, which uses the below-described composition for producing a p-type oxide of the present invention.

Other methods for producing a p-type oxide are appropriately selected depending on the intended purpose without any limitation, and examples thereof include sputtering, pulsed laser deposition (PLD), CVD, and ALD.

<Composition for Producing P-Type Oxide>

The composition for producing a p-type oxide of the present invention contains at least a solvent, a Cu-containing compound, and a compound containing an element M (may referred to as "an element M-containing compound" hereinafter), where the element M is selected from p-block elements, and can be in an equilibrium state in which there are both a state where all of electrons of p-orbital of an outermost shell are lost, and a state where all of electrons on the outermost shell are lost, as presented as an ion. The composition for producing a p-type oxide of the present invention may further contain other components, if necessary.

The composition for producing a p-type oxide is a composition used for production of the p-type oxide of the present invention.

-Solvent-

The solvent is appropriately selected depending on the intended purpose without any limitation, and examples thereof include toluene, xylene, 2-ethylhexanoic acid, acetyl acetone, ethylene glycol, and 2-methoxy ethanol.

In order to impart desirable properties (e.g., viscoelasticity, and dielectric constant) to the composition for producing a p-type oxide, moreover, a solvent, such as diethylene glycol, and dimethyl form amide, may be used.

These may be used independently, or in combination.

An amount of the solvent in the composition for producing a p-type oxide is appropriately selected depending on the intended purpose without any limitation.

-Cu-Containing Compound-

The valency of Cu in the p-type oxide is monovalent, but the valency of Cu in the Cu-containing compound is not limited to monovalent. The Cu-containing compound can be appropriately selected depending on the intended purpose, and examples so thereof include organic copper carboxylates, organic copper complexes, and inorganic copper salts. Examples of the organic copper carboxylates include copper (II) neodecanoate. Examples of the organic copper complex include copper(II) phthalocyanine, and copper(I) phenylacetylide. Examples of the inorganic copper salt include copper(II) nitrate, and copper(I) acetate.

Among them, in the case where the composition for producing a p-type oxide is produced with a non-polar solvent, the organic copper carboxylate is preferable, and copper(II) neodecanoate is more preferable in view of solubility. In the case where the composition for producing a p-type oxide is produced with a polar solvent, moreover, the inorganic copper salt is preferable, and copper(II) nitrate is more preferable in view of solubility.

An amount of the Cu-containing compound in the composition for producing a p-type oxide is appropriately selected depending on the intended purpose without any limitation.

-Element M-Containing Compound-

The element M-containing compound is appropriately selected depending on the intended purpose without any limitation, and examples thereof include a Sb-containing compound, and a Sn-containing compound.

Moreover, examples of the element M-containing compound include organometallic complexes containing the element M, organic carboxylic acid salts containing the element M, metal alkoxides containing the element M, and inorganic salts containing the element M.

- -Sb-Containing Compound- -

The Sb-containing compound is appropriately selected depending on the intended purpose without any limitation, and examples thereof include organometallic complexes containing Sb, organic carboxylic acid salts containing Sb, metal alkoxides containing Sb, and inorganic salts containing Sb. Examples of the inorganic salts containing Sb include antimony chloride.

Among them, in the case where the composition for producing a p-type oxide is produced with a non-polar solvent, is preferable in view of solubility. In the case where the composition for producing a p-type oxide is produced with a polar solvent, inorganic salts containing Sb are preferable, and antimony chloride is more preferable in view of solubility.

An amount of the Sb-containing compound in the composition for producing a p-type oxide is appropriately selected depending on the intended purpose without any limitation.

- -Sn-Containing Compound- -

The Sn-containing compound is appropriately selected depending on the intended purpose without any limitation, and examples thereof include organometallic complexes containing Sn, organic carboxylic acid salts containing Sn, metal alkoxides containing Sn, and inorganic salts containing Sn. Examples of the organic carboxylic acid salts containing Sn include tin 2-ethyl hexanoate. Examples of the inorganic salts having Sn include tin chloride.

Among them, in the case where the composition for producing a p-type oxide is produced with a non-polar solvent, the organic carboxylic acid salts containing Sn are preferable, and tin 2-ethyl hexanoate is more preferable, in view of solubility. In the case where the composition for producing a p-type oxide is produced with a polar solvent, moreover, the inorganic salts containing Sn are preferable, and tin chloride is more preferable, in view of solubility.

An amount of the Sn-containing compound in the composition for producing a p-type oxide is appropriately selected depending on the intended purpose without any limitation.

The composition for producing a p-type oxide of the present invention is suitable as a raw material solution used for producing the p-type oxide having excellent p-type electric conductivity. The valency of Cu in the p-type oxide is monovalent, but the valency of Cu in the Cu-containing compound, which is contained in the composition for producing a p-type oxide, is not limited to monovalent. The valency of Cu in the Cu-containing compound is preferably divalent. Specifically, in the case where the valency of Cu in the Cu-containing compound is divalent, there is one oxygen atom relative to one Cu atom, in the phase of the Cu oxide formed with Cu and oxygen, contributing to p-type electric conductivity, Cu is monovalent, and therefore there is one oxygen atom relative to two Cu atoms. Namely, in the course of production of the p-type oxide, the composition for producing a p-type oxide is in the oxygen excess state in the relationship between Cu and O. By using such composition for producing a p-type oxide, an oxygen content in the produced p-type oxide is increased, and carrier compensation due to oxygen deficiency is inhibited. Accordingly, the hole concentration is increased to thereby yield the p-type oxide having excellent p-type electric conductivity.

Since the blending ratio of the metal element composition and the solvent can be controlled in a wide range, moreover, the composition for producing a p-type oxide of the present invention can be appropriately adjusted depending on the below-described method for producing a p-type oxide or intended use.

<Method for Producing P-Type Oxide>

The method for producing a p-type oxide of the present invention contains at least a coating step, and a heat treat step, and may further contain other steps, if necessary.

-Coating Step-

The coating step is appropriately selected depending on the intended purpose without any limitation, provided that it includes applying a composition onto a support.

The composition is the composition for producing a p-type oxide of the present invention.

The support is appropriately selected depending on the intended purpose without any limitation, and examples thereof include a glass substrate.

The coating method is appropriately selected depending on the intended purpose without any limitation, and as for the coating method, conventional methods, such as spin coating, inkjet printing, slit coating, nozzle printing, gravure printing, and micro contact printing, can be used. Among them, in the case where intended is simple production of a film having a large area and uniform thickness, spin coating is preferable. Moreover, by using appropriate printing method (e.g., inkjet printing, and micro contact printing) and printing conditions, the composition can be printed in a desired shape, and therefore it is not necessary to perform patterning in a later step.

-Heat Treatment Step-

The heat treatment step is appropriately selected depending on the intended purpose without any limitation, provided that the heat treatment step is performing a heat treatment after the coating step, and is a step capable of drying of the solvent in the composition for producing a p-type oxide, decomposition of the Cu-containing compound, decomposition of the element M-containing compound (e.g., the Sb-containing compound, and the Sn-containing compound), and generation of the p-type oxide.

In the course of the heat treatment step, drying of the solvent (referred to as "drying process" hereinafter), and decomposition of the Cu-containing compound, decomposition of the element M-containing compound (e.g., the Sb-containing compound, and the Sn-containing compound), and generation of the p-type oxide (collectively referred to as "decomposition and generation process" hereinafter) are preferably performed at different temperature. Specifically, it is preferred that after drying the solvent, the temperature be elevated to perform decomposition of the Cu-containing compound, decomposition of the element M-containing compound (e.g., the Sb-containing compound, and the Sn-containing compound), and generation of the p-type oxide.

The temperature for the drying process is appropriately selected depending on the solvent as contained without any limitation, and for example, it is in the range of 80° C. to 180° C. For the drying, it is also effective to use a vacuum oven to lower the temperature used to the drying.

The duration for the drying process is appropriately selected depending on the intended purpose without any limitation, and for example, it is 10 minutes to 1 hour.

The temperature for the decomposition and generation process is appropriately selected depending on the intended purpose without any limitation, and for example, it is in the range of 200° C. to 400° C.

The duration for the decomposition and generation process is appropriately selected depending on the intended purpose without any limitation, and for example, it is 1 hour to 5 hours.

In the heat treatment step, the aforementioned process may be performed simultaneously, or may be divided into a plurality of steps.

A method for carrying out the heat treatment step is appropriately selected depending on the intended purpose without any limitation, and examples thereof include a method for heating the support.

The atmosphere in which the heat treatment step is carried out is appropriately selected depending on the intended purpose without any limitation, but it is preferably oxygen atmosphere. By performing the heat treatment in the oxygen atmosphere, a decomposition product can be promptly discharged from the system, and oxygen defects in the resulting p-type oxide can be reduced.

It is effective in the heat treatment step to apply UV light having the wavelength of 400 nm or shorter to the composition after the drying process, as a reaction of the decomposition and generation process is accelerated. The p-type oxide can be efficiently produced by applying the UV light having the wavelength of 400 nm or shorter, because upon application of the UV light, bond cleavage occurs in chemical bonds of organic materials contained in the composition and the organic materials are decomposed.

The UV light having the wavelength of 400 nm or shorter is appropriately selected depending on the intended purpose without any limitation, and examples thereof include UV light having a wavelength of 222 nm emitted from an excimer lamp.

Moreover, it is also preferable to apply ozone instead of, or in combination with the application of the UV light. By applying the ozone to the composition after the drying process, generation of oxide is accelerated.

The method for producing a p-type oxide of the present invention can produce the p-type oxide easily, with high quantity, and at low cost compared to a vacuum process, because the p-type oxide is produced by a coating process.

Moreover, the method for producing a p-type oxide of the present invention can produce the p-type oxide having excellent p-type electric conductivity. It is preferred in the method for producing a p-type oxide of the present invention that the Cu-containing compound containing the divalent Cu be used in the composition for producing a p-type oxide used for the aforementioned method. In this case, the valency of Cu in the composition for producing a p-type oxide is divalent, there is one oxygen atom relative to one Cu atom, but Cu is monovalent in a phase of the p-type oxide formed with the composition and contributing to p-type electric conductivity, there is one oxygen atom relative to two Cu atoms. Namely, in the course of production of the p-type oxide, the composition for producing a p-type oxide is in the oxygen excess state in the relationship between Cu and O. By using such composition for producing a p-type oxide, an oxygen content in the produced p-type oxide is increased, and generation of electrons caused by oxygen deficiency is inhibited. Accordingly, the hole concentration is increased to thereby yield the p-type oxide having excellent p-type electric conductivity.

(Semiconductor Element)

The semiconductor element of the present invention contains at least an active layer, and may further contain other members, if necessary.

<Active Layer>

The active layer is appropriately selected depending on the intended purpose without any limitation, provided that it contains the p-type oxide of the present invention.

As described earlier, the p-type oxide of the present invention attains properties depending on the intended purpose as a result of the adjustment of the composition, and therefore the p-type oxide of the present invention is suitably used in an active layer of the semiconductor element. Specifically, by adding the p-type oxide whose properties have been optimized to the active layer, properties of the semiconductor element cam be improved.

A structure, shape, and size of the active layer are appropriately selected depending on the intended purpose without any limitation.

Examples of the semiconductor element include a diode, a field-effect transistor, a light emitting element, and a photoelectric transducer.

<Diode>

The diode is appropriately selected depending on the intended purpose without any limitation, and examples thereof include a diode containing a first electrode, a second electrode, and an active layer formed between the first electrode and the second electrode. Examples of such diode include a pn-junction diode, and a PIN photodiode.

As for an n-type oxide semiconductor, many materials having high transmittance to visible light have been known. Since the p-type oxide of the present invention also transmits visible light with a wide-band gap, a transparent diode can be so produced using these materials.

-Pn-Junction Diode-

The pn-junction diode contains at least an active layer, and may further contain other members, such as an anode (anode), and a cathode (cathode), if necessary.

- -Active Layer- -

The active layer contains at least a p-type semiconductor layer, and an n-type semiconductor layer, and may further contain other members, if necessary.

The p-type semiconductor layer and the n-type semiconductor layer are in contact with each other.

- - -P-Type Semiconductor Layer- - -

The p-type semiconductor layer is appropriately selected depending on the intended purpose without any limitation, provided that the layer contains the p-type oxide of the present invention.

It is preferred that the composition or formation conditions of the p-type oxide be selected to attain carrier density and carrier mobility required to function as the active layer.

The average thickness of the p-type semiconductor layer is appropriately selected depending on the intended purpose without any limitation, but it is preferably 50 nm to 2,000 nm.

- - -N-Type Semiconductor Layer- - -

A material of the n-type semiconductor layer is appropriately selected depending on the intended purpose without any limitation, but it is preferably an n-type transparent oxide semiconductor.

The n-type transparent oxide semiconductor is appropriately selected depending on the intended purpose without any limitation, and examples thereof include ZnO, and IGZO (In—Ga—Zn—O).

In the case where the n-type transparent oxide semiconductor, the active layer can be made transparent as the p-type oxide of the present invention transmits visible light with wide-band gap.

A method for forming the n-type semiconductor layer is appropriately selected depending on the intended purpose without any limitation, and examples thereof include a vacuum process, and printing. Examples of the vacuum process include sputtering, pulsed laser deposition (PLD), CVD, and ALD. Examples of the printing include dip coating, inkjet printing, and nano imprinting.

The average thickness of the n-type semiconductor layer is appropriately selected depending on the intended purpose without any limitation, but it is preferably 50 nm to 2,000 nm.

In the case where both the p-type semiconductor layer and the n-type semiconductor layer are crystalline materials, excellent crystallinity cannot be attained due to mismatched lattices when these layers are laminated. As a result, a semiconductor element of excellent properties may not be produced. To avoid these problems, it is necessary to select materials whose lattices are matched. Accordingly, usable materials are limited.

On the other hand, by using the p-type oxide of the present invention for the p-type semiconductor layer, a desirable interface of a pn-junction can be formed without causing the aforementioned problem, even when the n-type semiconductor layer is crystalline. Namely, use of the p-type oxide of the present invention enable to widen selections of materials usable for a n-type semiconductor in the diode, as well as achieving excellent properties of an element.

- -Anode (Anode)- -

The anode is in contact with the p-type semiconductor layer.

A material of the anode is appropriately selected depending on the intended purpose without any limitation, and examples thereof include metal, such as Mo, Al, Au, Ag, and Cu, alloy thereof, transparent electric conductive oxide, and organic conductor. Examples of the transparent electric conductive oxide include indium tin oxide (ITO), and antimony-doped tin oxide (ATO). Examples of the organic conductor include polyethylene dioxythiophene (PEDOT), and polyaniline (PANI).

A shape, size and structure of the anode are appropriately selected depending on the intended purpose without any limitation.

The anode is arranged to be in contact with the p-type semiconductor layer. Among such arrangements, it is preferred that an ohmic contact be formed.

A method for forming the anode is appropriately selected depending on the intended purpose without any limitation, and examples thereof include (i) a method for forming a film by sputtering, or dip coating, followed by patterning by photolithography, and (ii) a method for directly forming a film having a desired shape by a printing process, such as inkjet printing, nanoimprint, and gravure.

- -Cathode (Cathode)- -

A material of the cathode is appropriately selected depending on the intended purpose without any limitation, and examples thereof include those materials listed in the descriptions of the anode.

A shape, size and structure of the cathode are appropriately selected depending on the intended purpose without any limitation.

The cathode is arranged to be in contact with the n-type semiconductor layer. Among such arrangements, it is preferred that an ohmic contact be formed.

A method for forming the cathode is appropriately selected depending on the intended purpose without any limitation, and examples thereof include those methods described as the formation methods in the descriptions of the anode.

- -Production Method of PN-Junction Diode- -

One example of the production method of the pn-junction diode illustrated in FIG. 1 will be explained.

At first, a cathode 2 is formed on a substrate 1.

A shape, structure and size of the substrate are appropriately selected depending on the intended purpose without any limitation.

A material of the substrate is appropriately selected depending on the intended purpose without any limitation, and examples thereof include a glass substrate, and a plastic substrate.

The glass substrate is appropriately selected depending on the intended purpose without any limitation, and examples thereof include non-alkali glass, and silica glass.

The plastic substrate is appropriately selected depending on the intended purpose without any limitation, and examples thereof include polycarbonate (PC), polyimide (PI), polyethylene terephthalate (PET), and polyethylene naphthalate (PEN).

Note that, a pre-treatment, such as oxygen plasma, UV ozone, and UV radiation washing, is preferably performed on the substrate to clean a surface thereof and to improve adhesion with another layer.

Next, an n-type semiconductor layer 3 is formed on the cathode 2.

Subsequently, a p-type semiconductor layer 4 is formed on the n-type semiconductor layer 3.

Then, an anode 5 is formed on the p-type semiconductor layer 4.

In the manner as described above, a pn-junction diode 6 is produced.

<Field-Effect Transistor>

The field-effect transistor contains at least a gate electrode, a source electrode, a drain electrode, an active layer, and a gate insulating layer, and may further contain other members, if necessary.

-Gate Electrode-

The gate electrode is appropriately selected depending on the intended purpose without any limitation, provided that it is an electrode for applying gate voltage.

A material of the gate electrode is appropriately selected depending on the intended purpose without any limitation, and examples thereof include metal such as Mo, Al, Au, Ag, and Cu, alloy thereof, transparent electric conductive oxide, and organic conductor. Examples of the transparent electric conductive oxide include indium tin oxide (ITO), and antimony-doped tin oxide (ATO). Examples of the organic conductor include polyethylene dioxythiophene (PEDOT), and polyaniline (PANI).

A method for forming the gate electrode is appropriately selected depending on the intended purpose without any limitation, and examples thereof include (i) a method for forming a film by sputtering, or dip coating, followed by patterning by photolithography, and (ii) a method for directly forming a film having a desired shape by a printing process, such as inkjet printing, nanoimprint, and gravure.

The average thickness of the gate electrode is appropriately selected depending on the intended purpose without any limitation, but it is preferably 20 nm to 1 µm, more preferably 50 nm to 300 nm.

-Source Electrode and Drain Electrode-

The source electrode and drain electrode are appropriately selected depending on the intended purpose without any limitation, provided that they are electrodes configured to extract electric current from the field-effect transistor.

A material of each of the source electrode and drain electrode is appropriately selected depending on the intended purpose without any limitation, and examples thereof include those materials described in the description of the gate electrode.

Large contact resistance between the active layer and the source electrode, or between the active layer and the drain electrode leads to deterioration of transistor properties. In order to avoid such deterioration, a material that will achieve low contact resistance is preferably selected as the source electrode and drain electrode. Specifically, it is preferred that a material having the larger work function than that of the p-type oxide of the present invention contained in the active layer be selected.

A method for forming each of the source electrode and the drain electrode is appropriately selected depending on the intended purpose without any limitation, and examples thereof include those methods described as a formation method in the descriptions for the gate electrode.

The average thickness of each of the source electrode, and the drain electrode is appropriately selected depending on the intended purpose without any limitation, but it is preferably 20 nm to 1 µm, more preferably 50 nm to 300 nm.

-Active Layer-

The active layer contains the p-type oxide of the present invention.

The active layer is formed between the source electrode and the drain electrode. Here, the aforementioned "between" is appropriately selected depending on the intended purpose without any limitation, provided that it is a location where the active layer can function as the field-effect transistor together with the source electrode and the drain electrode.

It is preferred that the composition or formation conditions of the p-type oxide be selected to attain carrier density and carrier mobility required to function as the active layer.

The average thickness of the active layer is appropriately selected depending on the intended purpose without any limitation, but it is preferably 5 nm to 1 µm, more preferably 10 nm to 300 nm.

-Gate Insulating Layer-

The gate insulating layer is appropriately selected depending on the intended purpose without any limitation, provided that it is an insulating layer formed between the gate electrode and the active layer.

A material of the gate insulating layer is appropriately selected depending on the intended purpose without any limitation, and examples thereof include: conventional material which have been widely manufactured, such as $SiO_2$, and SiNx; high dielectric constant materials such as $La_2O_3$, and $HfO_2$; and organic materials such as polyimide (PI) and a fluororesin.

A method for forming the gate insulating layer is appropriately selected depending on the intended purpose without any limitation, and examples thereof include: vacuum film forming methods, such as sputtering, chemical vapor so deposition (CVD), and atomic layer deposition (ALD); and printing methods such as spin coating, die coating, inkjet printing.

The average thickness of the gate insulating layer is appropriately selected depending on the intended purpose without any limitation, but it is preferably 50 um to 3 µm, more preferably 100 nm to 1 µm.

Figure 4:
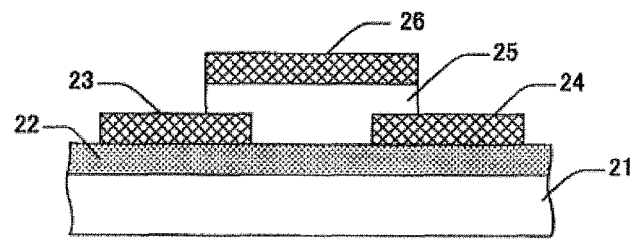
FIG. 4 is a schematic structure diagram illustrating one example of a top-contact and top-gate field-effect transistor.
Figure 5:
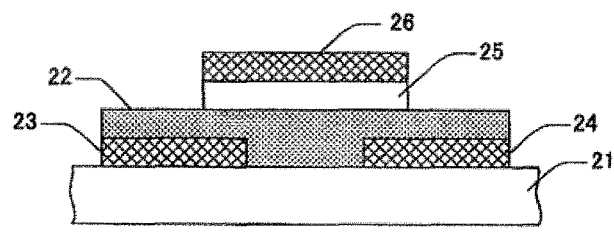
FIG. 5 is a schematic structure diagram illustrating one example of a bottom-contact and top-gate field-effect transistor.

A structure of the field-effect transistor is appropriately selected depending on the intended purpose without any limitation, and examples thereof include top-contact and bottom-gate (FIG. 2), bottom-contact and bottom-gate (FIG. 3), top-contact and top-gate (FIG. 4), and bottom-contact and top-gate (FIG. 5).

Note that, in FIGS. 2 to 5, 21 is a substrate (support), 22 is an active layer, 23 is a source electrode, 24 is a drain electrode, 25 is a gate insulating layer, and 26 is a gate electrode.

The field-effect transistor is suitably used for the below-described display element, but use thereof is not limited to the display element. For example, the field-effect transistor can be used for an IC card, or and ID tag.

Since the field-effect transistor uses the p-type oxide of the present invention in an active layer thereof, the active layer of desirable characteristics is realized by adjusting the composition, and therefore transistor property thereof is excellent. Moreover, le the active layer is amorphous and therefore having high uniformity. Therefore, dispersion in the property between transistors can be reduced.

-Production Method of Field-Effect Transistor-

One example of the production method of the field-effect transistor will be explained.

First, a gate electrode is formed on a substrate.

A shape, structure and size of the substrate are appropriately selected depending on the intended purpose without any limitation.

A material of the substrate is appropriately selected depending on the intended purpose without any limitation, and examples thereof include a glass substrate, and a plastic substrate.

The glass substrate is appropriately selected depending on the intended purpose without any limitation, and examples thereof include non-alkali glass, and silica glass.

The plastic substrate is appropriately selected depending on the intended purpose without any limitation, and examples thereof include polycarbonate (PC), polyimide (PI), polyethylene terephthalate (PET), and polyethylene naphthalate (PEN).

Note that, the substrate is preferably subjected to a pre-treatment, such as oxygen plasma, UV ozone, and UV-radiation washing.

Subsequently, a gate insulating layer is formed on the gate electrode.

Then, an active layer containing the p-type oxide is formed on the gate insulating layer in the channel region.

Subsequently, a source electrode and a drain electrode are formed on the gate insulating layer so that source electrode and the drain electrode are separated from each other with the active layer being present between them.

Figure 2:
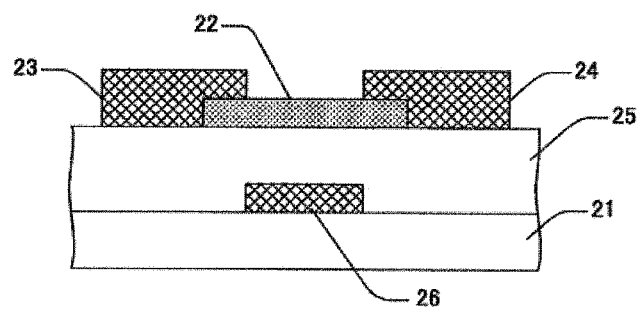
FIG. 2 is a schematic structure diagram illustrating one example of a top-contact and bottom-gate field-effect transistor.

In the manner as described above, a field-effect transistor is produced. In accordance with this production method, for example, a top-contact and bottom-gate field-effect transistor, as illustrated in FIG. 2, is produced.

The semiconductor element of the present invention contains the p-type oxide of the present invention in the active layer thereof. The p-type oxide can achieve the property (electric conductivity) suitable for the intended purpose by adjusting the composition thereof. Accordingly, by using the p-type oxide whose property is optimized as an active layer, the properties of the semiconductor element can be improved.

The field-effect transistor, as the semiconductor element of the present invention, can provide a TFT having excellent properties. Since the active layer is amorphous, high uniformity is achieved, and therefore dispersion in the property between transistors can be reduced.

(Display Element)

The display element of the present invention contains at least a light control element, and a driving circuit configured to drive the light control element, and may further contain other members, if necessary.

<Light Control Element>

The light control element is appropriately selected depending on the intended purpose without any limitation, provided that it is an element which controls light output according to a driving signal. Examples of the light control element include an organic luminescent (EL) element, an electrochromic (EC) element, a liquid crystal element, an electrophoretic element, and an electrowetting element.

<Driving Circuit>

The driving circuit is appropriately selected depending on the intended purpose without any limitation, provided that it has the semiconductor element of the present invention.

<Other Members>

Other members are appropriately selected depending on the intended purpose without any limitation.

The display element of the present invention contains the semiconductor element (e.g., the field-effect transistor) and therefore dispersion between the elements are small. Moreover, even in the case where the display element is aged, the driving transistor can be operated with a constant gate voltage, leading to a long life service of the element.

(Image Display Device)

The image display device of the present invention contains at least a plurality of display elements, wiring (plurality of lines), and a display control device, and may further contain other members, if necessary.

<Display Element>

The display elements are appropriately selected depending on the intended purpose without any limitation, provided that they are the display elements of the present invention arranged in a matrix.

<Wiring>

The wiring is appropriately selected depending on the intended purpose without any limitation, provided that it is capable of individually applying gate voltage and image data signals to each field-effect transistor in the display element.

<Display Control Device>

The display control device is appropriately selected depending on the intended purpose without any limitation, provided that it is capable of individually controlling the gate voltage and signal voltage of each field-effect transistor through the wiring, according to the image data.

<Other Members>

The aforementioned other members are appropriately selected depending on the intended purpose without any limitation.

The image display device of the present invention contains the display element of the present invention, and therefore the image display device can be stably operated with a long service life.

The image display device of the present invention can be used as a display unit in mobile information devices (e.g., a mobile phone, a mobile music player, a mobile video player, an electronic book, personal digital assistant (PDA)) or in imaging devices (e.g., a still camera, and a video camera). Moreover, the image display device can be used as a display unit for various information in a transporting system, such as a car, air craft, train, and ship. Further, the image display device can be used as a display unit for displaying various information in a measuring device, analysis device, medical device, or advertising media.

(System)

The system of the present invention contains at least the image display device of the present invention, and an image data forming device.

The image data forming device is configured to form image data based upon image information to be displayed, and to output the image date to the image display device.

The system of the present invention is equipped with the image display device of the present invention, and therefore the system can display image information with high precisions.

Next, the image display device of the present invention will be explained.

Figure 3:
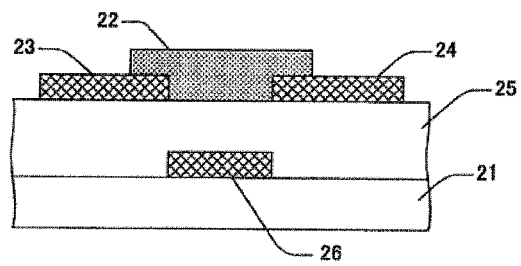
FIG. 3 is a schematic structure diagram illustrating one example of a bottom-contact and bottom-gate field-effect transistor.

The image display device of the present invention can apply the configuration, for example, described in the paragraphs [0059] to [0060], and FIGS. 2 and 3 of JP-A No. 2010-074148.

One example of the embodiment of the present invention will be explained with reference to the diagrams.

Figure 6:
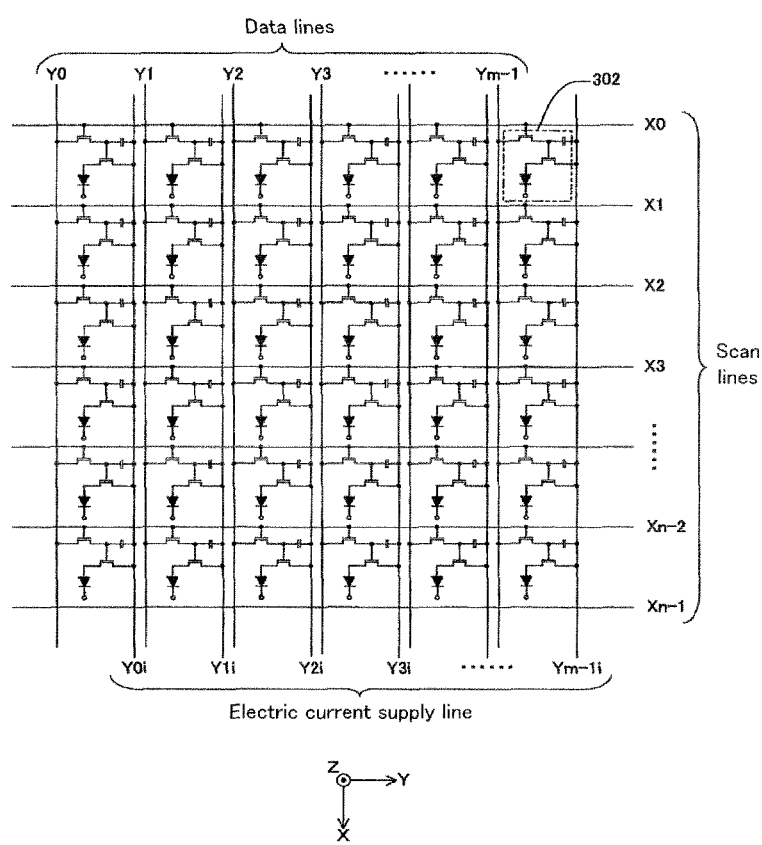
FIG. 6 is a diagram for explaining one example of an image display device.
Figure 6:

FIG. 6 is a diagram illustrating a display in which display elements are arranged on a matrix. As illustrated in FIG. 6, the display contains "n" number of scanning lines ($X0$, $X1$, $X2$, $X3$, . . . $Xn-2$, $Xn-1$) arranged along the X axis direction with a constant interval, "m" number of data lines ($Y0$, $Y1$, $Y2$, $Y3$, . . . $Ym-1$) arranged along the Y axis direction with a constant interval, and "m" number of electric current supply lines ($Y0i$, $Y1i$, $Y2i$, $Y3i$, . . . , Ym−1i) arranged along the Y axis direction with a constant interval. Note that, in FIGS. 7, 11, 12, and 13, the same reference sign (e.g., X1, Y1) denotes the same to the above.

As described, the display element 302 is specified with the scanning line and the data line.

Figure 7:
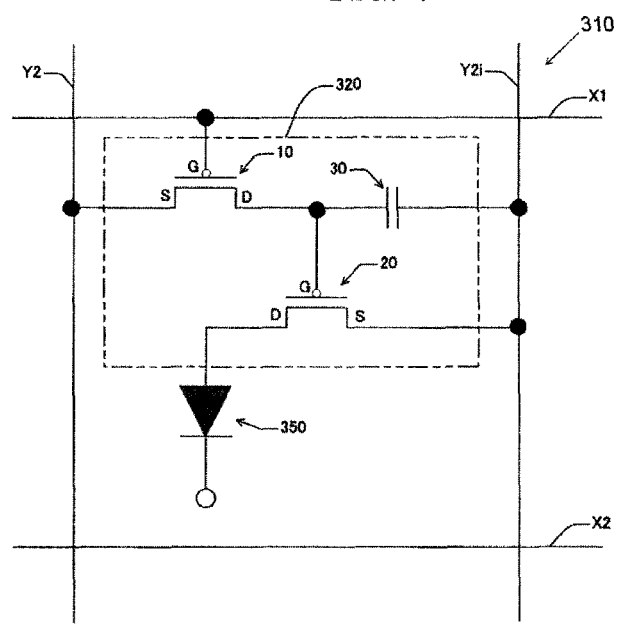
FIG. 7 is a diagram for explaining one example of the display element of the present invention.

FIG. 7 is a schematic structure diagram illustrating one example of the display element of the present invention.

As illustrated in FIG. 7 as an example, the display element contains an organic EL (luminescent) element 350, and a driving circuit 320 for making the organic EL element 350 emit. Namely, the display 310 is so called an active-matrix organic EL display. Moreover, the display 310 is a 32-inch color display. Note that, the size of the display is not limited to the aforementioned size.

The driving circuit 320 of FIG. 7 will be explained.

The driving circuit 320 contains two field-effect transistors 10 and 20, and a capacitor 30.

The field-effect transistor 10 functions as a switching element. The gate electrode G of the field-effect transistor 10 is connected with a certain scanning line, the source electrode S of the field-effect transistor 10 is connected with a certain data line. Moreover, the drain electrode D of the field-effect transistor 10 is connected with one of terminals of the capacitor 30.

The field-effect transistor 20 supplies electric current to the organic EL element 350. The gate electrode G of the field-effect transistor 20 is connected with the drain electrode D of the field-effect transistor 10. Moreover, the drain electrode D of the field-effect transistor 20 is connected with an anode of the organic EL element 350, and the source electrode S of the field-effect transistor 20 is connected with a certain electric current supply line.

The capacitor 30 is configured to store the state of the field-effect transistor 10, i.e. data. The other terminal of the capacitor 30 is connected with a certain electric current supply line.

When the field-effect transistor 10 is the "on" state, the image data is stored in the capacitor 30 through the signal line Y2. Even after turning the field-effect transistor 10 into the "off" state, the organic EL element 350 can be driven by maintaining the "on" state of the field-effect transistor 20 corresponding to the image data.

Figure 8:
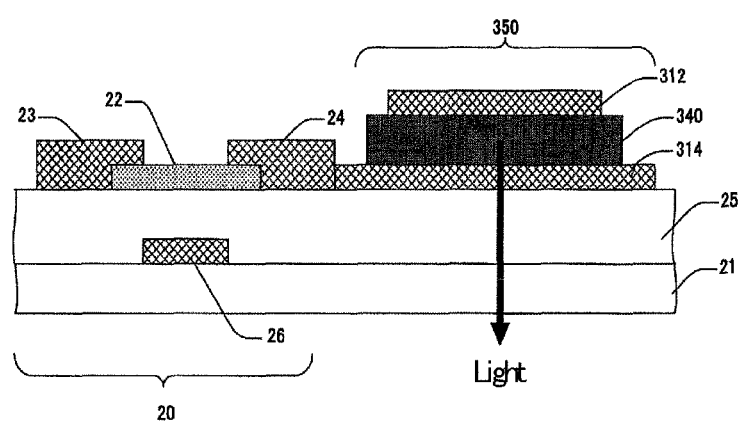
FIG. 8 is a schematic structure diagram illustrating one example of a physical relationship between an organic EL element and a field-effect transistor in the display element.

FIG. 8 illustrating one example of the positional relationship between the organic EL element 350 of the display element and the field-effect transistor 20 as a driving circuit. Here, the organic EL element 350 is arranged to be next to the field-effect transistor 20. Note that, the field-effect transistor and a capacitor (not illustrated) are formed on the same substrate.

Although it is not illustrated in FIG. 8, it is also preferred that a protective film be provided on the top of the active layer 22. As for a material of the protective film, $SiO_2$, SiNx, $Al_2O_3$, or fluoropolymer is suitably used.

Figure 9:
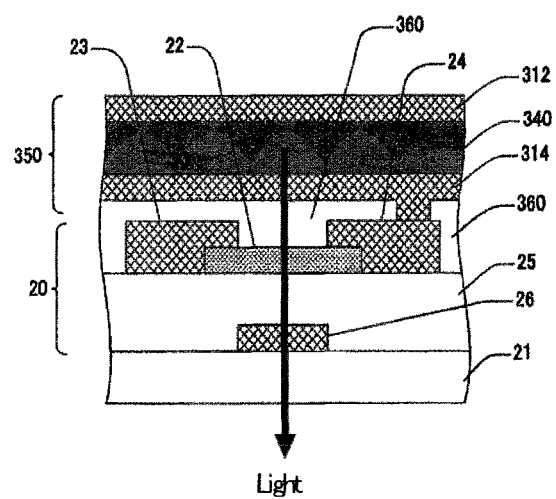
FIG. 9 is a schematic structure diagram illustrating another example of a physical relationship between an organic EL element and a field-effect transistor in the display element.

Moreover, the organic EL element 350 may be arranged on the field-effect transistor 20, for example, as illustrated in FIG. 9. In this case, the transparency is required to the gate electrode 26, and therefore transparent electric conductive oxide, such as ITO, $In_2O_3$, $SnO_2$, ZnO, Ga-doped ZnO, Al-doped ZnO, and Sb-doped $SnO_2$, is used for the gate electrode 26. Note that, the reference sign "360" denotes an interlayer insulating film (leveling film). As for the insulating film, for example, polyimide or an acrylic resin can be used.

In FIGS. 8 and 9, the field-effect transistor 20 contains a substrate 21, an active layer 22, a source electrode 23, a drain electrode 24, a gate insulating layer 25, and a gate electrode 26. The organic EL element 350 contains a cathode 312, an anode 314, and an organic EL thin film layer 340.

Figure 10:
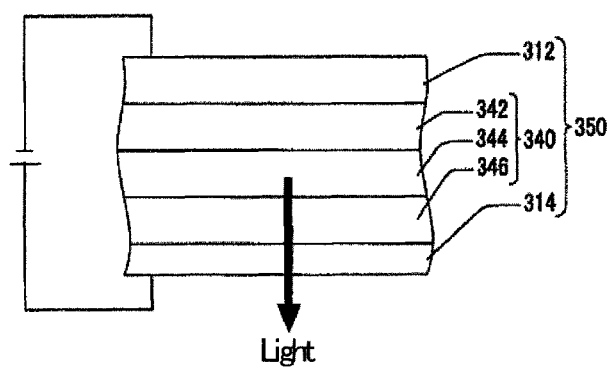
FIG. 10 is a schematic structure diagram illustrating one example of an organic EL element.

FIG. 10 is a schematic structure diagram illustrating one example of an organic EL element.

In FIG. 10, the organic EL element 350 contains a cathode 312, an anode 314, and an organic EL thin film layer 340.

A material of the cathode 312 is appropriately selected depending on the intended purpose without any limitation, and examples thereof include aluminum (Al), magnesium (MO-silver (Ag) alloy, aluminum (Al)-lithium (Li) alloy, and ITO (Indium Tin Oxide). Note that, the magnesium (Mg)-silver (Ag) alloy with a sufficient thickness functions as an electrode of high reflectance, and a very thin film (less than about 20 nm) thereof functions as a transparent electrode. In the diagram, light is led out from the side of the anode, but light can be taken out from the side of so the cathode by making the cathode clear, or using a transparent electrode as the cathode.

A material of the anode 314 is appropriately selected depending on the intended purpose without any limitation, and examples thereof include ITO (Indium Tin Oxide). IZO (Indium Zinc Oxide), and silver (Ag)-neodymium(Nd) alloy. Note that, when the silver alloy is used for the anode, the anode is an electrode of high reflectance, which is suitable for the case where light is taken out from the side of the cathode.

The organic EL thin film-layer 340 contains an electron transporting layer 342, a light emitting layer 344, and a hole transporting layer 346. The electron transporting layer 342 is connected to the cathode 312, and the hole transporting layer 346 is connected to the anode 314. Upon application of certain voltage between the anode 314 and the cathode 312, the light emitting layer 344 emits light.

Here, the electron transporting layer 342 and the light emitting layer 344 may be jointly form one layer. Moreover, an electron injecting layer may be provided between the electron transporting layer 342 and the cathode 312. Further, a hole injecting layer may be provided between the hole transporting layer 346 and the anode 314.

Moreover, explained above in the embodiment of "bottom emission" where light is taken out from the side of the substrate (the bottom side in FIG. 10), but the organic EL element may employ "top emission" where light is taken out from the opposite side to the side of the substrate (the bottom side in FIG. 10).

Figure 11:
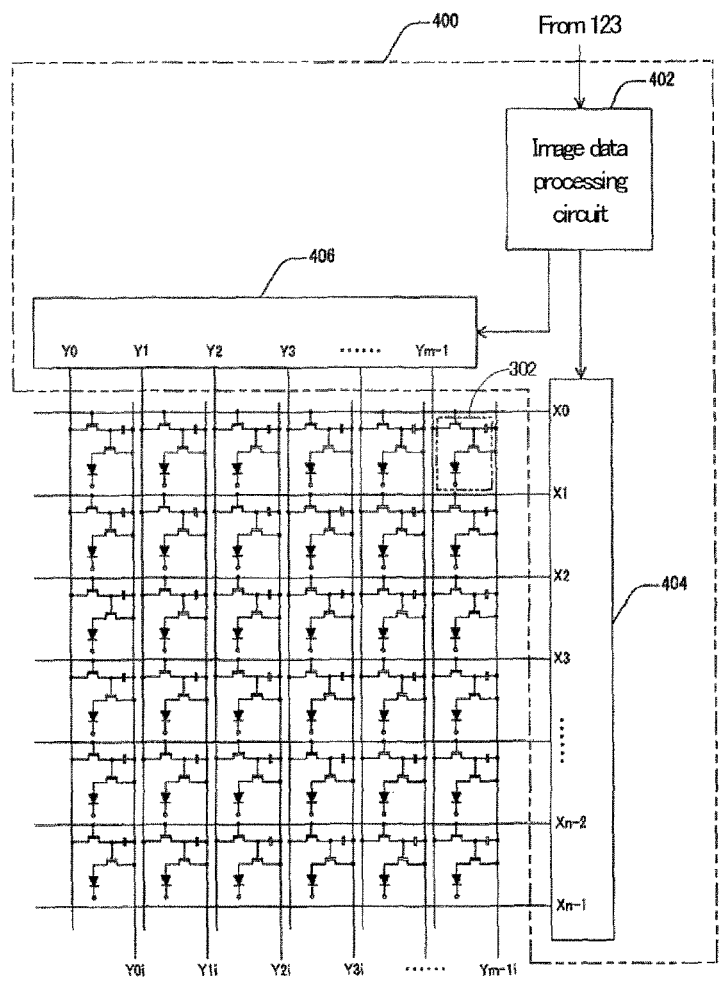
FIG. 11 is a diagram for explaining one example of a display control device.

FIG. 11 is a schematic structure diagram illustrating another example of the image display device of the present invention.

In FIG. 11, the image display device contains a display element 302, wiring (scanning line, data line, electric current supply line), and a display control device 400.

The display control device 400 contains a image data processing circuit 402, a scanning line driving circuit 404, and a data line driving circuit 406.

The image data processing circuit 402 determines luminance of a plurality of the display element 302 on the display based on the output signal of the image output circuit.

The scanning line driving circuit 404 applies voltage to each of ("n" number of) scanning lines in response to the command from the image data processing circuit 402.

The data line driving circuit 406 applies voltage to each of ("m" number of) data lines in response to the command from the image data processing circuit 402.

Moreover, the embodiment above explains the case where the light control element is the organic EL element, but the light control element is not limited to the organic EL element. For example, the light control element may be an electrochromic element. In such case, the display is an electrochromic display.

Figure 12:
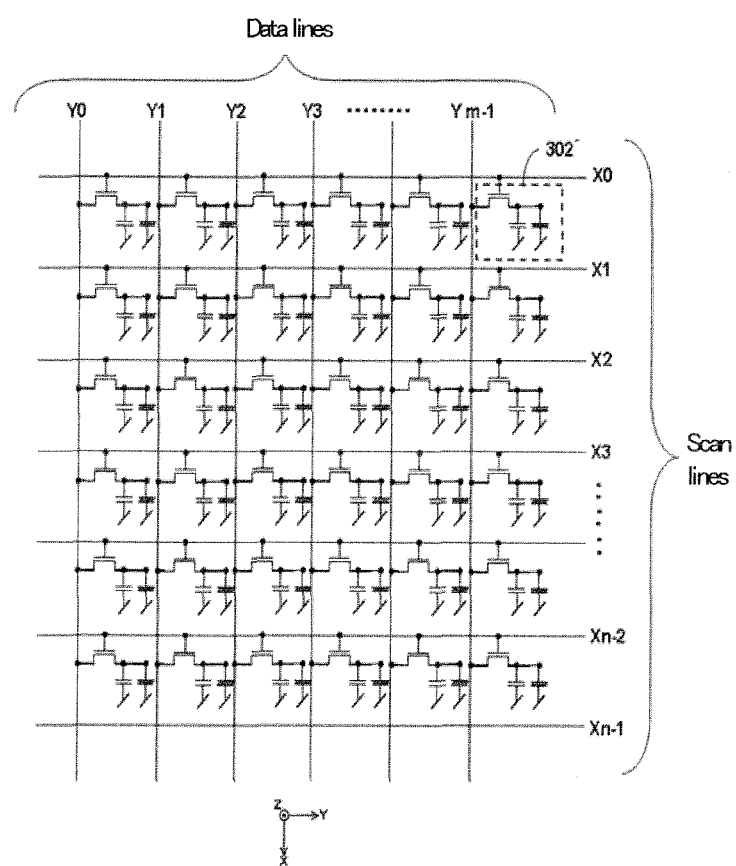
FIG. 12 is a diagram for explaining one example of a liquid crystal display.
Figure 13:
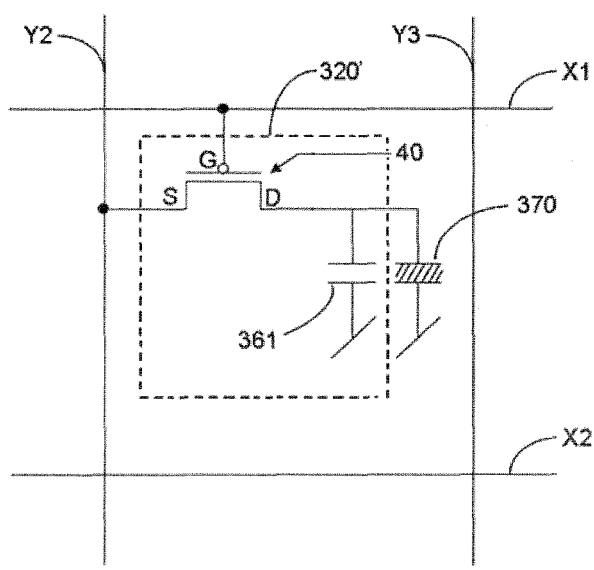
FIG. 13 is a diagram for explaining the display element of FIG. 12.

Further, the light control element may be a liquid crystal element. In this case, the display is a liquid crystal display, and an electric current supply line for the display element 302' is not required, as illustrated in FIG. 12. As illustrated in FIG. 13, moreover, the driving circuit 320' can be composed of one field-effect transistor 40 having the same structure as those of the field-effect transistors 10 and 20. In the field-effect transistor 40, the gate electrode G is connected with a certain scanning line, and the source electrode S is connected with a certain data line. Moreover, the drain electrode D is connected with the capacitor 361 and with a pixel electrode of the liquid crystal element 370.

Moreover, the light control element may be any of an electrophoretic element, an inorganic EL element, or an electrowetting element.

The embodiment where the system of the present invention is a television device has been explained above, but the system is not limited to the television device. The system may be applied as any system, as long as it has an image display device as a device for displaying images and information. For example, the system may be a computer system in which a computer (including a personal computer) and an image display device are connected.

The system of the present invention contains the image display device of the present invention, and therefore the system is stably operated with a long service life.

EXAMPLES

Examples of the present invention will be explained hereinafter, but these examples shall not be construed to as limit the scope of the present invention in any way.

Examples 1 to 6

Preparation of Cu—Sb Oxide (Amorphous) Film

Inks for Cu—Sb oxide (compositions for producing a p-type oxide), each of which had the formulation and Sb/Cu molar ratio depicted in Table 1, were prepared. Specifically, a copper neodecanoate (8.28% by mass) toluene solution and a triphenyl antimony (5.83% by mass) toluene solution were blended in accordance with the formulation depicted in Table 1 so that a ratio of Cu moles in a resulting ink to Sb moles in the resulting ink (Sb/Cu molar ratio) was to be 2.5%, 6.3%, 12.5%, 18%, 25%, and 100%, respectively, to thereby prepare 6 different inks for Cu—Sb oxide (compositions for producing a p-type oxide). Note that, 0.5 mL of toluene was added to the formulation depicted in Table 1.

Next, the ink for Cu—Sb oxide was applied onto a glass substrate by spin coating. After drying the ink for 1 hour at 120° C., the ink was baked for 3 hours at 250° C. while applying light emitted excimer lamp (wavelength: 222 nm) in a flow of oxygen gas, to thereby form a Cu—Sb oxide film (p-type oxide film).

TABLE 1

| | Sb/Cu molar ratio [%] | copper neodecanoate (8.28 mass %) toluene solution [mL] | triphenyl antimony (5.83 mass %) toluene solution [mL] | film thickness [nm] | volume resistivity [Ωcm] |
|---|---|---|---|---|---|
| Ex. 1 | 2.5 | 0.153 | 0.01 | 39.4 | 3.39E+00 |
| Ex. 2 | 6.3 | 0.153 | 0.025 | 42 | 8.00E+00 |

TABLE 1-continued

| | Sb/Cu molar ratio [%] | copper neodecanoate (8.28 mass %) toluene solution [mL] | triphenyl antimony (5.83 mass %) toluene solution [mL] | film thickness [nm] | volume resistivity [Ωcm] |
|---|---|---|---|---|---|
| Ex. 3 | 12.5 | 0.153 | 0.05 | 41 | 5.72E+01 |
| Ex. 4 | 18 | 0.153 | 0.07 | 42.1 | 4.87E+02 |
| Ex. 5 | 25 | 0.153 | 0.1 | 37.2 | 1.27E+05 |
| Ex. 6 | 100 | 0.153 | 0.4 | 73.1 | 6.58E+06 |

Figure 14:
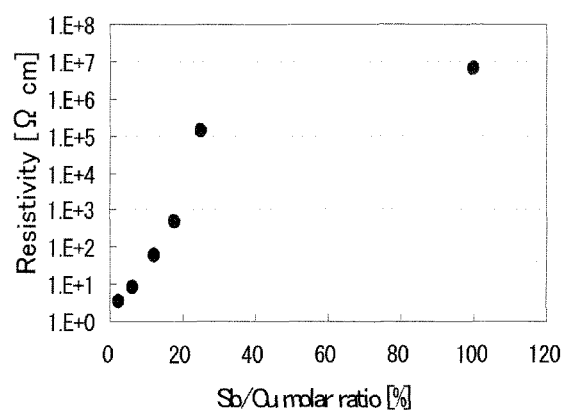
FIG. 14 is a diagram depicting the volume resistivity of the p-type oxide of Examples 1 to 6.
Figure 24:
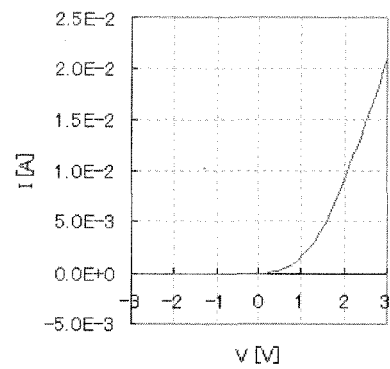
FIG. 24 is a diagram depicting Current-voltage (I-V) characteristics of diode produced in Example 8.

Note that, in Table 1, E denotes "the exponent of 10." For example, "1.0E+01" represents "10," and "1.0E+02" represents "100." E depicted in Table 2, FIGS. 14 and 24 denotes the same.

Comparative Example 1

Production of Cu—Sb Oxide (Crystal)

A Cu—Sb oxide film (Sb/Cu molar ratio: 2.5%) prepared in the same manner as in Example 1 was heated at 500° C. for 1 hour in ambient atmosphere.

Comparative Example 2

Production of Cu—Sb Oxide (Crystal)

A Cu—Sb oxide film (Sb/Cu molar ratio: 2.5%) prepared in the same manner as in Example 1 was heated at 500° C. for 1 hour in nitrogen atmosphere.

TABLE 2

| | Sb/Cu molar ratio [%] | conditions for heat treatment | film thickness [nm] | volume resistivity [Ωcm] |
|---|---|---|---|---|
| Comp. Ex. 1 | 2.5 | 500° C., for 1 hour in atmosphere | 43.2 | 5.43E+10 |
| Comp. Ex. 2 | 2.5 | 500° C., for 1 hour in nitrogen gas | 42.2 | 3.10E+01 |

The oxide films obtained in Examples 1 to 6 and Comparative Examples 1 to 2 were each subjected to a measurement of a thickness (film thickness) and a measurement of volume resistivity. Further, the oxide films were each subjected to X-ray diffraction analysis.

<Thickness>

A thickness of the oxide film was determined by measuring and analyzing a reflection spectrum with the wavelength of about 300 nm to about 700 nm, as measured by reflection spectroscopic film thickness meter (FE-3000, manufactured by Otsuka Electronics Co., Ltd.). The results are presented in Tables 1 and 2.

<Volume Resistivity>

On each of the oxide films produced in Examples 1 to 6, and Comparative Examples 1 to 2, Au was deposited through a metal mask by vapor deposition, to thereby form an electrode in the shape of a pair of lines. Current-voltage (I-V) characteristics between the electrodes were measured to thereby determine volume resistivity. The results are presented in Tables 1 and 2. Moreover, a relationship between the Sb/Cu molar ratio and the (volume) resistivity presented in Table 1 is depicted in FIG. 14.

As presented in Table 1 and FIG. 14, electric conductivity was confirmed in all of Examples. Moreover, there was a tendency that the volume resistivity increased as the Sb/Cu molar ratio increased, and the volume resistivity changed from about 20 Ωcm to about $10^7$ Ωcm.

<X-Ray Diffraction>

X-ray diffraction analysis was performed on the oxide films of Examples 1 to 6 and Comparative Examples 1 to 2 by means of X'PertPro (Philips).

Figure 15:
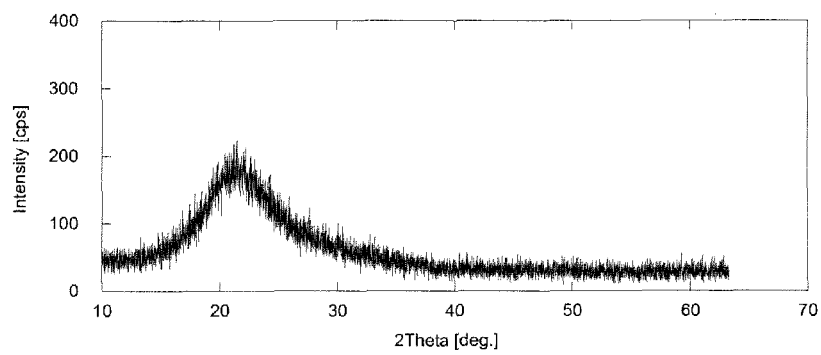
FIG. 15 depicts the measurement result of X-ray diffraction of the p-type oxide of Example 1.
Figure 16:
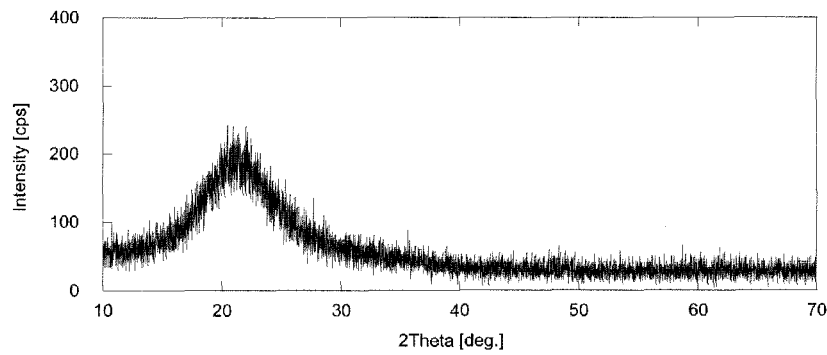
FIG. 16 depicts the measurement result of X-ray diffraction of the p-type oxide of Example 2.
Figure 17:
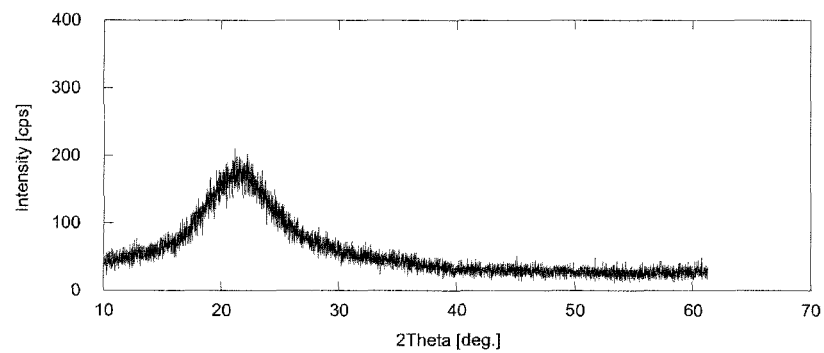
FIG. 17 depicts the measurement result of X-ray diffraction of the p-type oxide of Example 3.
Figure 18:
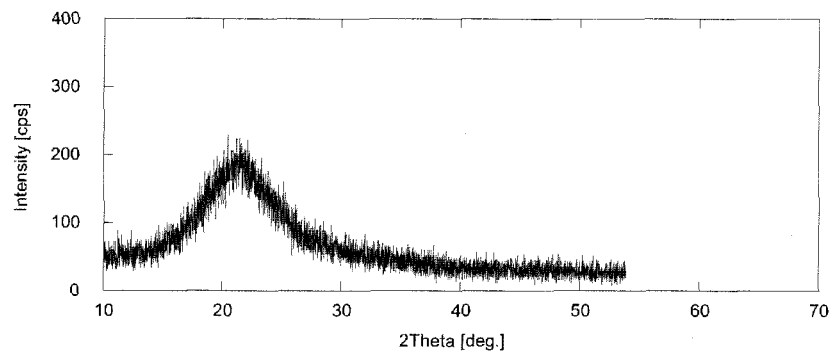
FIG. 18 depicts the measurement result of X-ray diffraction of the p-type oxide of Example 4.
Figure 19:
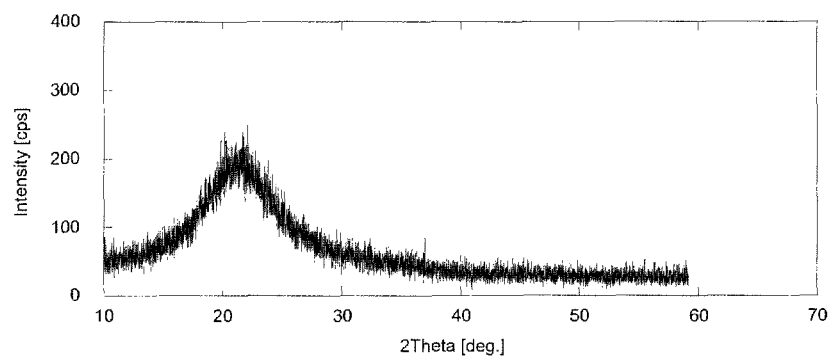
FIG. 19 depicts the measurement result of X-ray diffraction of the p-type oxide of Example 5.
Figure 20:
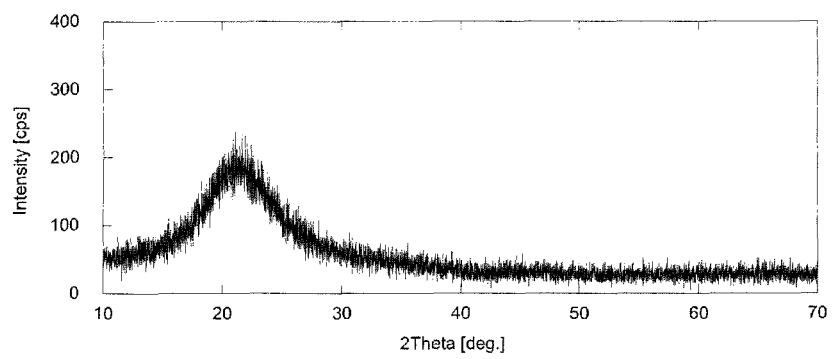
FIG. 20 depicts the measurement result of X-ray diffraction of the p-type oxide of Example 6.
Figure 21:
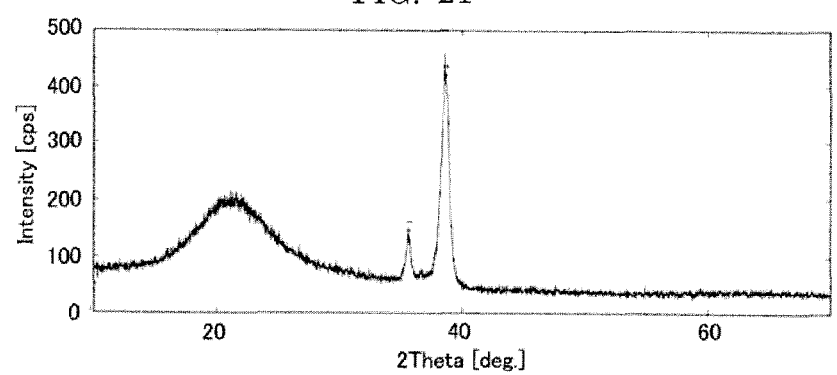
FIG. 21 depicts the measurement result of X-ray diffraction of the Cu—Sb oxide of Comparative Example 1.
Figure 22:
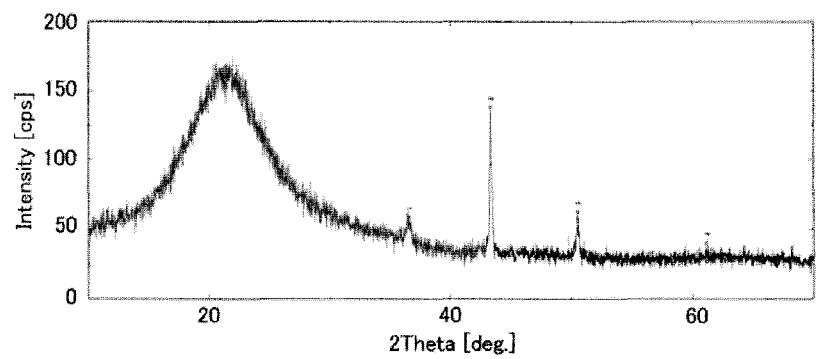
FIG. 22 depicts the measurement result of X-ray diffraction of the Cu—Sb oxide of Comparative Example 2.

The results of the X-ray diffraction measurements of the p-type oxide of Example 1 are depicted in FIG. 15. The results of the X-ray diffraction measurements of the p-type oxide of Example 2 are depicted in FIG. 16. The results of the X-ray diffraction measurements of the p-type oxide of Example 3 are depicted in FIG. 17. The results of the X-ray diffraction measurements of the p-type oxide of Example 4 are depicted in FIG. 18. The results of the X-ray diffraction measurements of the p-type oxide of Example 5 are depicted in FIG. 19. The results of the X-ray diffraction measurements of the p-type oxide of Example 6 are depicted in FIG. 20. The results of the X-ray diffraction measurements of the p-type oxide of Comparative Example 1 are depicted in FIG. 21. The results of the X-ray diffraction measurements of the p-type oxide of Comparative Example 2 are depicted in FIG. 22.

No diffraction peak was found in all of the 6 samples of Examples 1 to 6, and therefore it was confirmed that these Cu—Sb oxide films were each in the state of amorphous.

Several diffraction peaks were found from the results of the X-ray diffraction measurements performed on the sample of Comparative Example 1, and it was found from the angle (2θ) thereof that CuO crystals were present in the oxide of Comparative Example 1. It is considered that oxygen has taken into the film during the heating treatment to thereby generate CuO.

The results of the X-ray diffraction measurements performed on the sample of Comparative Example 2 show that there are diffraction peaks at angles corresponding to $Cu_2O$ crystal and metal Cu, and therefore it has been found that metal Cu is generated by reduction occurred during the heating treatment.

The p-type oxide film of the present invention can be used various semiconductor elements, but properties (resistivity) required for a semiconductor in the semiconductor element generally vary depending on types and characteristics of the semiconductor element. Therefore, the value of the Sb/Cu molar ratio can be appropriately selected depending on the intended purpose.

The Current-voltage (I-V) characteristics measured between the Au electrodes of the sample of Comparative Example 1 did not exhibited a linear relation ship, and the sample had high resistance, i.e., volume resistivity of $10^{10}$ Ωcm or higher. It is considered that sufficient electric conductivity was not obtained because a large amount of CuO crystals, in which Cu was divalent, was contained in the film.

The sample of Comparative Example 2 achieved low resistivity similar to that of the sample of Example 1. With reference to the results of the X-ray diffraction measurements, however, the electric conductivity thereof seemed to be partially contributed by the metal Cu. Accordingly, an object of attaining excellent p-type electric conductivity has not been achieved by the film of Comparative Example 2.

Specifically, the crystalline Cu—Sb oxide has not been able to control p-type electric conductivity.

Example 7

Production of Cu—Sb Oxide Film (Amorphous)

In 10 mL of ethylene glycol, 2.42 g (corresponding to 10 mmol) of copper nitrate trihydrate was dissolved to prepare a copper raw material solution. Moreover, 2.29 g (corresponding to 10 mmol) of antimony chloride was dissolved in 10 mL propylene glycol to thereby prepare an antimony raw material solution.

The copper raw material solution (5 mL) and the antimony raw material solution (0.9 mL) were mixed and stirred to thereby prepare an ink for Cu—Sb oxide (composition for producing a p-type oxide). A ratio of Cu moles in the ink to Sb moles in the ink (Sb/Cu molar ratio) was 18%.

Next, a glass substrate was coated with the ink for Cu—Sb oxide by spin coating. After drying the ink at 120° C. for 1 hour, the ink was baked at 250° C. for 3 hours while applying light emitted from an excimer lamp (wavelength: 222 nm) in a flow of oxygen gas, to thereby form a Cu—Sb oxide film (p-type oxide film). The Sb/Cu molar ratio in the obtained film was 18%, and the film having the same composition to that of Example 4 was formed.

The film thickness and volume resistivity of the film was measured in the same manner as in Example 1. As a result, the film thickness was 89 nm, and the volume resistivity was $6.28 \times 10^2$ Ωcm. It was confirmed that the volume resistivity of the film was similar to the volume resistivity ($4.87 \times 10^2$ Ωcm) of the p-type film of Example 4. Accordingly, it was confirmed that, even in the case where different types of the Cu-containing compound, Sb-containing compound, and solvent are used during the formulation of the ink, the p-type oxide film having the substantially similar electric conductive characteristics could be obtained as long as the molar ratio of Cu and Sb was the same.

Figure 23:
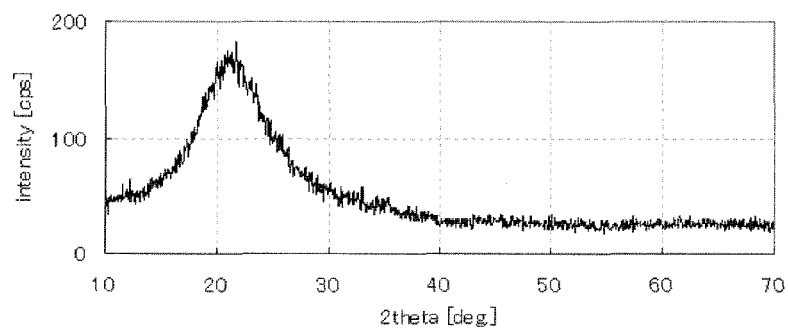
FIG. 23 depicts the measurement result of X-ray diffraction of the p-type oxide of Example 7.

The results of the X-ray diffraction measurements performed on the film obtained in Example 7 are presented in FIG. 23. As presented in FIG. 23, it was confirmed that the film obtained in Example 7 was also in the state of amorphous.

Example 8

Production of PN-Junction Diode

-Preparation of Substrate-

As for a substrate, non-alkali glass substrate (plate thickness: 0.7 mm) was used. The glass substrate was washed by ultrasonic cleaning using a neutral detergent, pure water, and isopropyl alcohol. After drying the substrate, the substrate was further subjected to a UV-ozone treatment at 90° C. for 10 minutes.

-Formation of Cathode-

On the glass substrate, Al was deposited to a thickness of 100 nm through a metal mask by vapor deposition, to thereby form a cathode.

-Formation of N-Type Semiconductor Layer-

On the cathode, a Mg—In oxide film was formed by radio frequency sputtering through a metal mask. As a target, a polycrystalline sintered body (size (diameter): 1 inches) having a composition of $In_2MgO_4$ was used. The ultimate pressure in the sputtering chamber was set to $2 \times 10^{-5}$ Pa. The flow rates of argon gas and oxygen gas during the sputtering were controlled to achieve the total pressure of 1.0 Pa, and oxygen partial pressure of $6.0 \times 10^{-2}$ Pa. The temperature of the substrate was not particularly controlled during the sputtering. The power and duration of the sputtering were respectively adjusted to 150 W, and 15 minutes, to thereby form a Mg—In oxide film having a thickness of 160 nm.

-Formation of P-Type Semiconductor Layer-

On the n-type semiconductor layer, a Cu—Sb oxide film (Sb/Cu molar ratio: 12.5%) was formed in the same manner as in Example 3. The thickness of the Cu—Sb oxide film was 48.5 nm.

-Formation of Anode-

On the p-type semiconductor layer, Au was deposited to a thickness of 100 nm through a metal mask by vapor deposition, to thereby form an anode.

By the processes described above, a pn-junction diode was obtained.

<Evaluation>

The current-voltage (I-V) characteristics of the diode obtained in Example 8 were measured. The result is presented in FIG. 24. It was found from the result that a typical rectification was obtained. Specifically, the result exhibited that the pn-junction diode could be realized by using the p-type oxide of the present invention as the active layer.

Example 9

Production of Field-Effect Transistor

-Preparation of Substrate (Gate Electrode, Gate Insulating Layer)-

As for a substrate, a Si substrate with a thermally oxidized film (thickness: 200 nm) was used. The Si substrate was washed by ultrasonic cleaning using neutral detergent, pure water, and isopropyl alcohol. After drying the substrate, a UV-ozone treatment was further performed on the substrate at 90° C. for 10 minutes. Note that, the thermally oxidized film is a gate insulating layer, and the Si substrate is a gate electrode.

-Formation of Active Layer-

The ink for Cu—Sb oxide film (Sb/Cu molar ratio: 2.5%) produced in Example 1 was applied onto the substrate by spin coating. After drying the ink at 120° C. for 1 hour, the ink was baked at 250° C. for 3 hours while applying light emitted from an excimer lamp (wavelength: 222 nm) in a flow of oxygen gas, to thereby form a Cu—Sb oxide film (Sb/Cu molar ratio: 2.5%) having the average thickness of 45 nm.

Thereafter, a photoresist was applied thereon, and the coated photoresist was subjected to prebake, exposure by an exposure equipment, and developing, to thereby form a resist pattern having the same pattern as an active layer to be formed. Moreover, the Cu—Sb oxide film in the area on which the resist pattern was not formed was removed by wet etching, followed by removing the resist pattern, to thereby form an active layer.

-Formation of Source Electrode and Drain Electrode-

On the active layer, Cr was deposited to a thickness of 1 nm, followed by depositing Au to a thickness of 100 nm, through a metal mask by vapor deposition to thereby form a source electrode and a drain electrode. The channel length thereof was 50 μm, and the channel width thereof was 0.4 mm.

Finally, annealing was performed at 300° C. for 1 hour in a flow of oxygen gas, to thereby produce a field-effect transistor.

<Evaluation>

The transfer characteristics ($V_{ds}$=−20V) of the field-effect transistor produced in Example 9 was measured, and the result thereof showed the excellent p-type characteristic of a normally off type.

Example 10

Production of Field-Effect Transistor

-Preparation of Substrate (Gate Electrode, Gate Insulating Layer)-

As for a substrate, a Si substrate with a thermally oxidized film (thickness: 200 nm) was used. The Si substrate was washed by ultrasonic cleaning using neutral detergent, pure water, and isopropyl alcohol. After drying the substrate, a UV-ozone treatment was further performed on the substrate at 90° C. for 10 minutes. Note that, the thermally oxidized film is a gate insulating layer, and the Si substrate is a gate electrode.

-Formation of Source Electrode and Drain Electrode-

On the Si substrate with the thermally oxidized film, hexamethyldisilazane (HMDS) was applied by spin coating, followed by a drying process, to thereby give a hydrophobing treatment to the surface of the substrate. Subsequently, an under layer resist for lift-off was formed by spin coating and a drying process. On the under layer resist, a photosensitive photoresist was formed by spin coating and a drying process. After patterning the resist through exposure via a photo mask and developing, a film of Pt, which was an electrode material, was formed by DC sputtering. As for a target, Pt (size (diameter): 4 inches) was used. The ultimate pressure in the sputtering chamber was set to $1\times10^{-3}$ Pa. During the sputtering, a flow of argon gas was supplied, and the pressure was set to 0.35 Pa. The temperature of the substrate was not particularly controlled during the sputtering. The power and duration of the sputtering were respectively adjusted to DC 200 W, and 6 minutes 15 seconds, to thereby form a Pt film having a thickness of 50 nm.

Subsequently, the substrate on which the Pt film had been formed was immersed in N-methylpyrrolidone to remove unwanted parts of Pt together with the resists, to thereby obtain intended shape Pt source electrode and Pt drain electrode.

-Preparation of Semiconductor Ink for Inkjet Printing-

In 10 mL of ethylene glycol, 2.42 g (corresponding to 10 mmol) of copper nitrate trihydrate was dissolved to thereby prepare a copper raw material solution. Moreover, 2.29 g (corresponding to 10 mmol) of antimony chloride was dissolved in 10 mL of ethylene glycol to thereby prepare an antimony raw material solution.

Ethylene glycol (2.25 mL), ethylene glycol monobutyl ether (4.5 mL), the copper raw material solution (2 mL), and the antimony raw material solution (0.25 mL) were mixed and stirred to thereby prepare a semiconductor ink for inkjet printing (Cu—Sb semiconductor ink). The ratio of Cu moles in the ink and the Sb moles in the ink (Sb/Cu molar ratio) was 12.5%.

-Formation of Active Layer-

The Cu—Sb semiconductor ink (Sb/Cu molar ratio: 12.5%) was applied onto an intended area of the substrate on which the source-drain electrode had been formed by means of an inkjet equipment. After drying the ink for 1 hour at 120° C., the ink was baked for 3 hours at 250° C. while applying light emitted from an excimer lamp (wavelength: 222 nm), to thereby form a Cu—Sb oxide film (Sb/Cu molar ratio: 12.5%) having a thickness of 52 nm.

Finally, annealing was performed at 300° C. for 1 hour to thereby produce a field-effect transistor.

Figure 25:
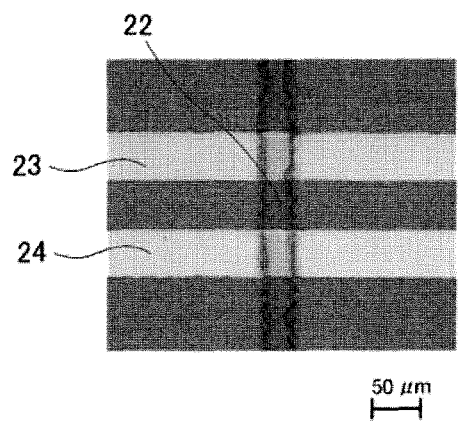
FIG. 25 is a microscopic photograph of a channel of the field-effect transistor produced in Example 10.

The microscopic photograph of the channel area of the field-effect transistor is depicted in FIG. 25. The space between the source electrode 23 and the drain electrode 24 was a channel length, which was 50 μm. A channel width was defined with a width of the active layer 22 applied in the shape of a longitudinal line, and in the field-effect transistor of the photograph, the channel width was 37 μm.
<Evaluation>

The transfer characteristics ($V_{ds}$=−20V) of the field-effect transistor produced in Example 10 was measured, and the result thereof showed the excellent p-type characteristic of a normally off type. In Example 10, the field-effect transistor was produced by a simpler method, without patterning in a later step, as the Cu—Sb oxide film (Sb/Cu molar ratio: 12.5%) was formed only in the intended area by inkjet printing in Example 10, comparing to Example 9 where the Cu—Sb oxide film (Sb/Cu molar ratio: 2.5%) was formed by spin coating, followed by processing the film to have an intended shape by wet etching.

Examples 11 to 17

Preparation of Cu—Sn Oxide (Amorphous) Film

Inks for Cu—Sn oxide (compositions for producing a p-type oxide), each of which had the formulation and Sn/Cu molar ratio depicted in Table 3, were prepared. Specifically, a copper neodecanoate (8.28% by mass) toluene solution and a tin 2-ethyl hexanoate (27.83% by mass) toluene solution were blended in accordance with the formulation depicted in Table 3 so that a ratio of Cu moles in a resulting ink to Sn moles in the resulting ink (Sn/Cu molar ratio) was to be 2.5%, 6.3%, 12.5%, 18%, 25%, 50%, and 100%, respectively, to thereby prepare 7 different inks for Cu—Sn oxide (compositions for producing a p-type oxide). Note that, 0.5 mL of toluene was added to the formulation depicted in Table 3.

Next, the ink for Cu—Sn oxide was applied onto a glass substrate by spin coating. After drying the ink for 1 hour at 120° C., the ink was baked for 3 hours at 250° C. while applying light emitted from an excimer lamp (wavelength: 222 nm) in a flow of oxygen gas, to thereby form a Cu—Sn oxide film (p-type oxide film).

TABLE 3

| | Sn/Cu molar ratio [%] | copper neodecanoate (8.28 mass %) toluene solution [mL] | tin 2-ethyl hexanoate (27.83 mass %) toluene solution [mL] | film thickness [nm] | volume resistivity [Ωcm] |
|---|---|---|---|---|---|
| Ex. 11 | 2.5 | 0.153 | 0.0017 | 47.2 | 5.61E+00 |
| Ex. 12 | 6.3 | 0.153 | 0.0043 | 49.6 | 2.51E+01 |
| Ex. 13 | 12.5 | 0.153 | 0.0085 | 46.2 | 6.53E+01 |
| Ex. 14 | 18 | 0.153 | 0.012 | 48.6 | 9.53E+02 |
| Ex. 15 | 25 | 0.153 | 0.017 | 42.6 | 1.52E+05 |
| Ex. 16 | 50 | 0.153 | 0.034 | 55.1 | 1.44E+07 |
| Ex. 17 | 100 | 0.153 | 0.068 | 114.7 | 3.06E+06 |

Figure 36:
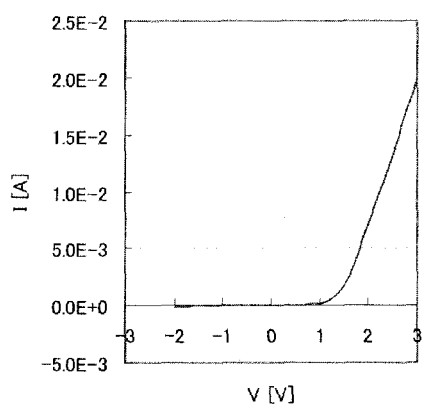
FIG. 36 is a diagram depicting the Current-voltage (V) characteristics of the diode produced in Example 19.

Note that, in Table 3, E denotes "the exponent of 10." For example, "1.0E+01" represents "10," and "1.0E+02" represents "100." E depicted in Table 4, FIGS. 16 and 36 denotes the same.

Comparative Example 3

Production of Cu—Sn Oxide (Crystal)

A Cu—Sn oxide film (Sn/Cu molar ratio: 2.5%) prepared in the same manner as in Example 11 was heated at 300° C. for 1 hour in ambient-atmosphere.

TABLE 4

| | Sn/Cu molar ratio | Conditions for heat treatment | Film thickness [nm] | Volume resistivity [Ωcm] |
|---|---|---|---|---|
| Comp. Ex. 3 | 2.5 | 300° C. for 1 hour in atmosphere | 45.0 | 2.10E+13 |

The oxide films obtained in Examples 11 to 17 and Comparative Example 3 were each subjected to a measurement of a thickness (film thickness) and a measurement of volume resistivity in the same manner as in Example 1. Further, the oxide films were each subjected to X-ray diffraction analysis.

The results of the film thickness and volume resistivity are presented in Tables 3 and 4.

Figure 26:
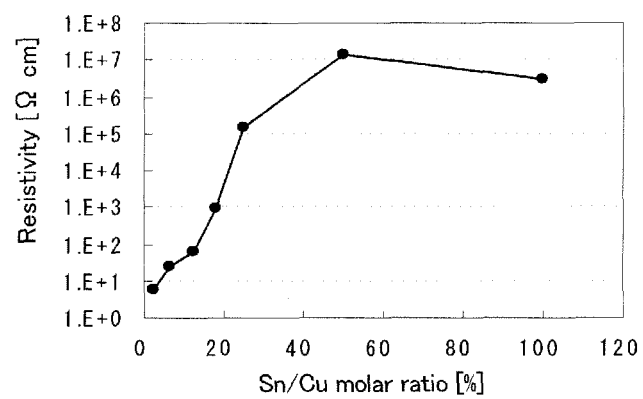
FIG. 26 is a diagram depicting the volume resistivity of the p-type oxides of Examples 11 to 17.

The relationship between the Sn/Cu molar ratio and (volume) resistivity depicted in Table 3 is presented in FIG. 26.

Figure 27:
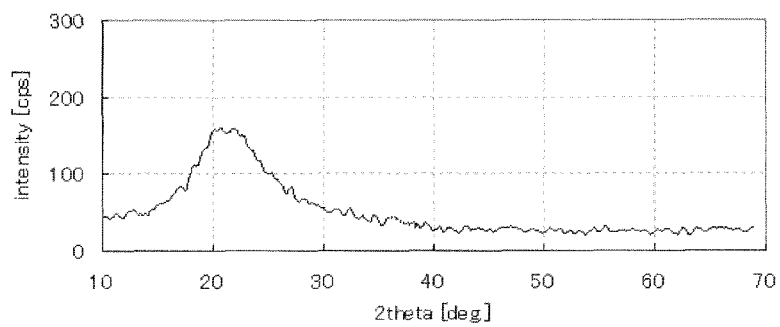
FIG. 27 depicts the measurement result of X-ray diffraction of the p-type oxide of Example 11.
Figure 28:
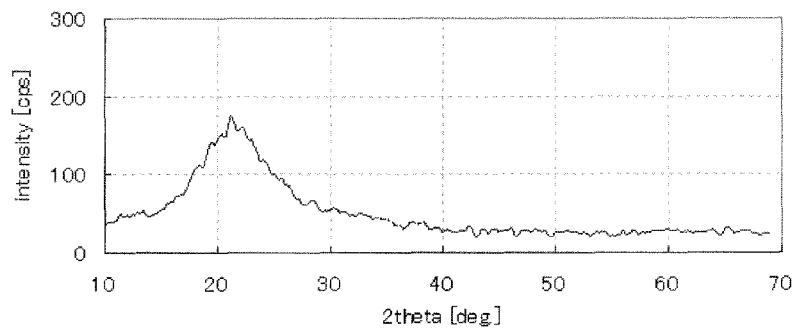
FIG. 28 depicts the measurement result of X-ray diffraction of the p-type oxide of Example 12.
Figure 29:
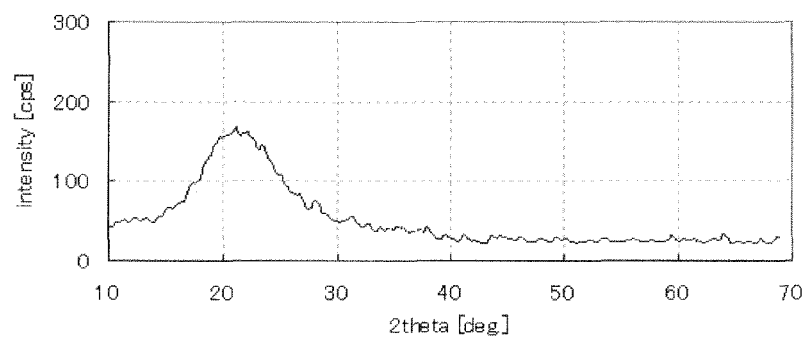
FIG. 29 depicts the measurement result of X-ray diffraction of the p-type oxide of Example 13.
Figure 30:
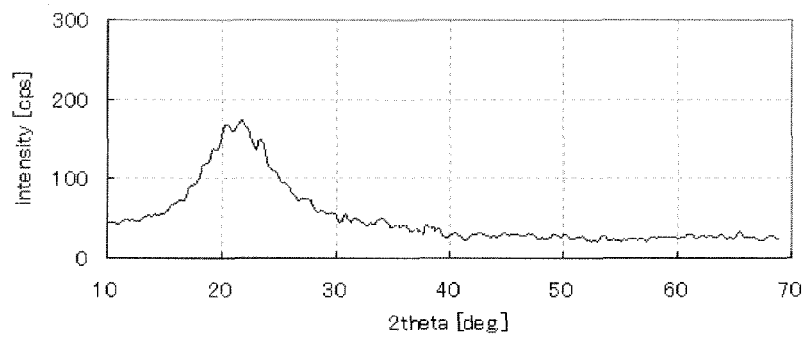
FIG. 30 depicts the measurement result of X-ray diffraction of the p-type oxide of Example 14.
Figure 31:
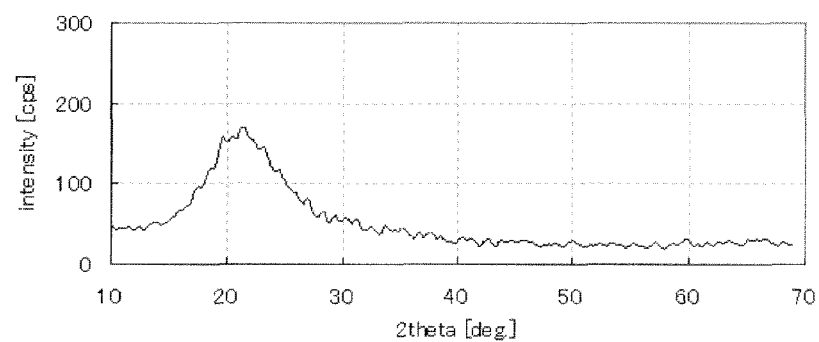
FIG. 31 depicts the measurement result of X-ray diffraction of the p-type oxide of Example 15.
Figure 32:
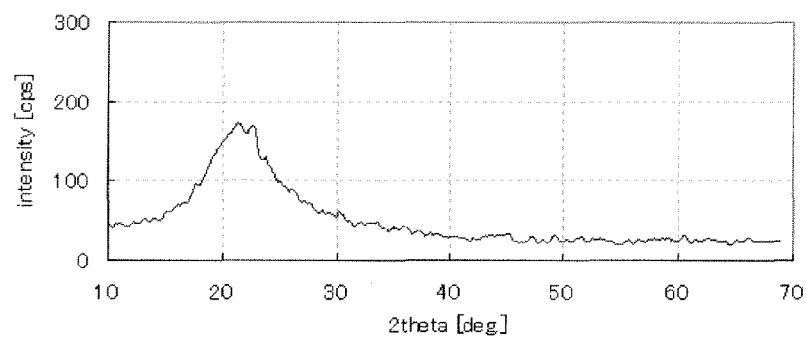
FIG. 32 depicts the measurement result of X-ray diffraction of the p-type oxide of Example 16.
Figure 33:
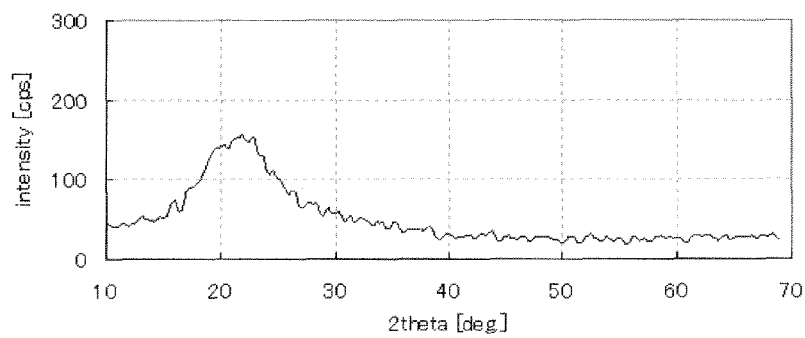
FIG. 33 depicts the measurement result of X-ray diffraction of the p-type oxide of Example 17.
Figure 34:
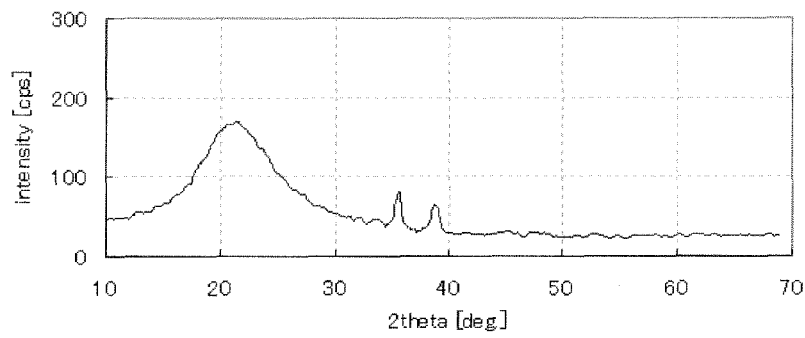
FIG. 34 depicts the measurement result of X-ray diffraction of the Cu—Sb oxide of Comparative Example 3.

The results of the X-ray diffraction measurements of the p-type oxide of Example 11 are depicted in FIG. 27. The results of the X-ray diffraction measurements of the p-type oxide of Example 12 are depicted in FIG. 28. The results of the X-ray diffraction measurements of the p-type oxide of Example 13 are depicted in FIG. 29. The results of the X-ray diffraction measurements of the p-type oxide of Example 14 are depicted in FIG. 30. The results of the X-ray diffraction measurements of the p-type oxide of Example 15 are depicted in FIG. 31. The results of the X-ray diffraction measurements of the p-type oxide of Example 16 are depicted in FIG. 32. The results of the X-ray diffraction measurements of the p-type oxide of Example 17 are depicted in FIG. 33. The results of the X-ray diffraction measurements of the p-type oxide of Comparative Example 3 are depicted in FIG. 34.

No diffraction peak was found in all of the 7 samples of Examples 11 to 17, and therefore it was confirmed that these Cu—Sn oxide films were each in the state of amorphous.

Several diffraction peaks were found from the results of the X-ray diffraction measurements performed on the sample of Comparative Example 3, and it was found from the angle (2θ) thereof that CuO crystals were present in the oxide of Comparative Example 3. It is considered that oxygen has taken into the film during the heating treatment to thereby generate CuO.

The p-type oxide film of the present invention can be used various semiconductor elements, but properties (resistivity) required for a semiconductor in the semiconductor element generally vary depending on types and characteristics of the semiconductor element. Therefore, the value of the Sn/Cu molar ratio can be appropriately selected depending on the intended purpose.

The Current-voltage (I-V) characteristics measured between the Au electrodes of the sample of Comparative Example 3 did not exhibited a linear relation ship, and the sample had high resistance, i.e., volume resistivity of $10^{13}$ Ωcm or higher. It is considered that sufficient electric conductivity was not obtained because a large amount of CuO crystals, in which Cu was divalent, was contained in the film.

Specifically, the crystalline Cu—Sn oxide has not been able to control p-type electric conductivity.

Example 18

Production of Cu—Sn Oxide Film (Amorphous)

In 10 mL of ethylene glycol, 2.42 g (corresponding to 10 mmol) of copper nitrate trihydrate was dissolved to thereby prepare a copper raw material solution. Moreover, 1.9 g (corresponding to 10 mmol) of tin chloride was dissolved in 10 mL of propylene glycol to thereby prepare a tin raw material solution.

The copper raw material solution (5 mL) and the tin raw material solution (0.9 mL) were mixed and stirred to thereby prepare an ink for Cu—Sn oxide. The ratio of Cu moles in the ink and Sn moles in the ink (Sn/Cu: molar ratio) was 18%.

Next, a glass substrate was coated with the ink for Cu—Sn oxide by spin coating. After drying the ink at 120° C. for 1 hour, the ink was baked at 250° C. for 3 hours while applying light emitted from an excimer lamp (wavelength: 222 nm) in a flow of oxygen gas, to thereby form a Cu—Sn oxide film (p-type oxide film). The Sn/Cu molar ratio in the obtained film was 18%, and the film having the same composition to that of Example 14 was formed.

The film thickness and volume resistivity of the film was measured in the same manner as in Example 11. As a result, the film thickness was 98 nm, and the volume resistivity was $1.12 \times 10^3$ Ωcm. It was confirmed that the volume resistivity of the film was similar to the volume resistivity ($9.53 \times 10^2$ Ωcm) of the p-type film of Example 14. Accordingly, it was confirmed that, even in the case where different types of the Cu-containing compound, Sn-containing compound, and solvent are used during the formulation of the ink, the p-type oxide film having the substantially similar electric conductive characteristics could be obtained as long as the molar ratio of Cu and Sn was the same.

Figure 35:
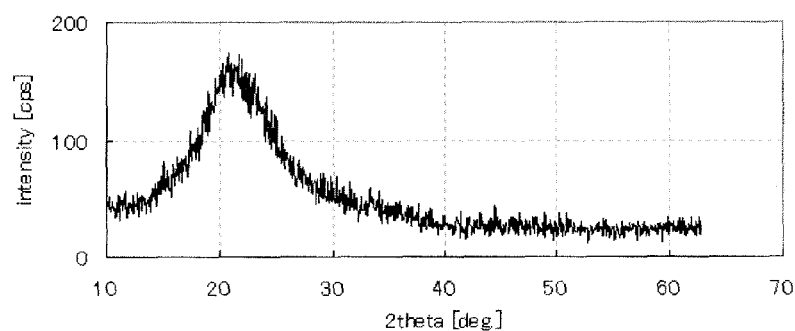
FIG. 35 depicts the measurement result of X-ray diffraction of the p-type oxide of Example 18.

The results of the X-ray diffraction measurements performed on the film obtained in Example 18 are presented in FIG. 35. As presented in FIG. 35, it woe confirmed that the film obtained in Example 18 was also in the state of amorphous.

Example 19

Production of PN-Junction Diode

-Preparation of Substrate-

As for a substrate, non-alkali glass substrate (plate thickness: 0.7 mm) was used. The glass substrate was washed by ultrasonic cleaning using a neutral detergent, pure water, and isopropyl alcohol. After drying the substrate, the substrate was further subjected to a UV-ozone treatment at 90° C. for 10 minutes.

-Formation of Cathode-

On the glass substrate, Al was deposited to a thickness of 100 nm through a metal mask by vapor deposition, to thereby form a cathode.

-Formation of N-Type Semiconductor Layer-

On the cathode, a Mg—In oxide film was formed by radio frequency sputtering through a metal mask. As a target, a polycrystalline sintered body (size (diameter): 4 inches) having a composition of $In_2MgO_4$ was used. The ultimate pressure in the sputtering chamber was set to $2 \times 10^{-5}$ Pa. The flow rates of argon gas and oxygen gas during the sputtering were controlled to achieve the total pressure of 1.0 Pa, and oxygen partial so pressure of $6.0 \times 10^{-2}$ Pa. The temperature of the substrate was not particularly controlled during the sputtering. The power and duration of the sputtering were respectively adjusted to 150 W, and 15 minutes, to thereby form a Mg—In oxide film having a thickness of 160 nm.

-Formation of P-Type Semiconductor Layer-

On the n-type semiconductor layer, a Cu—Sn oxide film (Sn/Cu molar ratio: 12.5%) was formed in the same manner as in Example 13. The thickness of Cu—Sn oxide film was 45.5 nm.

-Formation of Anode-

On the p-type semiconductor layer, Au was deposited to a thickness of 100 nm through a metal mask by vapor deposition, to thereby form an anode.

By the processes described above, a pn-junction diode was obtained.

<Evaluation>

The current-voltage (I-V) characteristics of the diode obtained in Example 19 were measured. The result is presented in FIG. 36. It was found from the result that a typical rectification was obtained. Specifically, the result exhibited that the pn-junction diode could be realized by using the p-type oxide of the present invention as the active layer.

Example 20

Production of Field-Effect Transistor

-Preparation of Substrate (Gate Electrode, Gate Insulating Layer)-

As for a substrate, a Si substrate with a thermally oxidized film (thickness: 200 nm) was used. The Si substrate was washed by ultrasonic cleaning using neutral detergent, pure water, and isopropyl alcohol. After drying the substrate, a UV-ozone treatment was further performed on the substrate at 90° C. for 10 minutes. Note that, the thermally oxidized film is a gate insulating layer, and the Si substrate is a gate electrode.

-Formation of Active Layer-

The ink for Cu—Sn oxide film (Sn/Cu molar ratio: 2.5%) produced in Example 11 was applied onto the substrate by spin coating. After drying the ink at 120° C. for 1 hour, the ink was baked at 250° C. for 3 hours while applying light emitted from an excimer lamp (wavelength: 222 nm) in a flow of oxygen gas, to thereby form a Cu—Sn oxide film (Sn/Cu molar ratio: 2.5%) having the average thickness of 49 nm.

Thereafter, a photoresist was applied thereon, and the coated photoresist was subjected to prebake, exposure by an exposure equipment, and developing, to thereby form a resist pattern having the same pattern as an active layer to be formed. Moreover, the Cu—Sn oxide film in the area on which the resist pattern was not formed was removed by wet etching, followed by removing the resist pattern, to thereby form an active layer.

-Formation of Source Electrode and Drain Electrode-

On the active layer, Cr was deposited to a thickness of 1 nm, followed by depositing Au to a thickness of 100 nm, through a metal mask by vapor deposition to thereby form a source electrode and a drain electrode. The channel length thereof was 50 μm and the channel width thereof was 0.4 mm.

<Evaluation>

The transfer characteristics ($V_{ds}=-20V$) of the field-effect transistor produced in Example 20 was measured, and the result thereof showed the excellent p-type characteristic of a normally off type.

Example 21

Production of Field-Effect Transistor

-Preparation of Substrate (Gate Electrode, Gate Insulating Layer)-

As for a substrate, a Si substrate with a thermally oxidized film (thickness: 200 nm) was used. The Si substrate was washed by ultrasonic cleaning using neutral detergent, pure water, and isopropyl alcohol. After drying the substrate, a UV-ozone treatment was further performed on the substrate at 90° C. for 10 minutes. Note that, the thermally oxidized film is a gate insulating layer, and the Si substrate is a gate electrode.

-Formation of Source Electrode and Drain Electrode-

On the Si substrate with the thermally oxidized film, hexamethyldisilazane (HMDS) was applied by spin coating, followed by a drying process, to thereby give a hydrophobing treatment to the surface of the substrate. Subsequently, an under layer resist for lift-off was formed by spin coating and a drying process. On the under layer resist, a photosensitive photoresist was formed by spin coating and a drying process. After patterning the resist through exposure via a photo mask and developing, a film of Pt, which was an electrode material, was formed by DC sputtering. As for a target, Pt (size (diameter): 4 inches) was used. The ultimate pressure in the sputtering chamber was set to $1\times10^{-3}$ Pa. During the sputtering, a flow of argon gas was supplied, and the pressure was set to 0.35 Pa. The temperature of the substrate was not particularly controlled during the sputtering. The power and duration of the sputtering were respectively adjusted to DC 200 W, and 6 minutes and 15 seconds, to thereby form a Pt film having a thickness of 50 nm.

Subsequently, the substrate on which the Pt film had been formed was immersed in N-methylpyrrolidone to remove unwanted parts of Pt together with the resists, to thereby obtain intended shape Pt source electrode and Pt drain electrode.

-Preparation of Semiconductor Ink for Inkjet Printing-

In 10 mL of ethylene glycol, 2.42 g (corresponding to 10 mmol) of copper nitrate trihydrate was dissolved to thereby prepare a copper raw material solution. Moreover, 1.90 g (corresponding to 10 mmol) of tin chloride was dissolved in 10 mL of ethylene glycol to thereby prepare a tin raw material solution.

Ethylene glycol (2.25 mL), ethylene glycol monobutyl ether (4.5 mL), the copper raw material solution (2 mL), and the tin raw material solution (0.25 mL) were mixed and stirred to thereby prepare a semiconductor ink for inkjet printing (Cu—Sn semiconductor ink). The ratio of Cu moles in the ink and the Sn moles in the ink (Sn/Cu molar ratio) was 12.5%.

-Formation of Active Layer-

The Cu—Sn semiconductor ink (Sn/Cu molar ratio: 12.5%) was applied onto an intended area of the substrate on which the source-drain electrode had been formed by means of an inkjet equipment. After drying the ink for 1 hour at 120° C., the ink was baked for 3 hours at 250° C. while applying light emitted from an excimer lamp (wavelength: 222 nm), to thereby form a Cu—Sn oxide film (Sn/Cu molar ratio: 12.5%) having a thickness of 48 nm.

Finally, annealing was performed at 300° C. for 1 hour to thereby produce a field-effect transistor.

Figure 37:
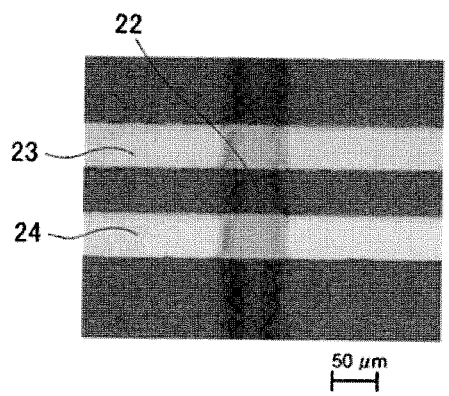
FIG. 37 is a microscopic photograph of a channel of the field-effect transistor produced in Example 21.

The microscopic photograph of the channel area of the field-effect transistor is depicted in FIG. 37. The space between the source electrode 23 and the drain electrode 24 was a channel length, which was 50 µm. A channel width was defined with a width of the active layer 22 applied in the shape of a longitudinal line, and in the field-effect transistor of the photograph, the channel width was 54 µm.

<Evaluation>

The transfer characteristics ($V_{ds}$=−20V) of the field-effect transistor produced in Example 21 was measured, and the result thereof showed the excellent p-type characteristic of a normally off type. In Example 21, the field-effect transistor was produced by a simpler method, without patterning in a later step, as the Cu—Sn oxide film (Sn/Cu molar ratio: 12.5%) was formed only in the intended area by inkjet printing in Example 21, comparing to Example 20 where the Cu—Sn oxide film (Sn/Cu molar ratio: 2.5%) was formed by spin coating, followed by processing the film to have an intended shape by wet etching.

Embodiments of the present invention are, for example, as follows:

<1> A p-type oxide, including:
an oxide,
wherein the oxide includes:
Cu; and
an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost,
wherein the p-type oxide is amorphous.

<2> The p-type oxide according to <1>, wherein the element M includes Sb, or Sn, or both thereof.

<3> A composition for producing a p-type oxide, which is used for production of the p-type oxide according to any of <1> or <2>,
the composition for producing a p-type oxide, including:
a solvent;
a Cu-containing compound; and
an element M-containing compound, where the element M is selected from p-block elements, and can be in an equilibrium state as being present as an ion, wherein the equilibrium state is a state in which there are both a state where all of electrons of p-orbital of an outermost shell are lost, and a state where all of electrons of an outermost shell are lost.

<4> A method for producing the p-type oxide according to any of <1> or <2>, the method including:
applying a composition on a support: and
performing a heat treatment after the applying,
wherein the composition includes:
a solvent;
a Cu-containing compound; and
an element M-containing compound, where the element M is selected from p-block elements, and can be in an equilibrium state as being present as an ion, wherein the equilibrium state is a state in which there are both a state where all of electrons of p-orbital of an outermost shell are lost, and a state where all of electrons of an outermost shell are lost.

<5> A semiconductor element, including:
an active layer,
wherein the active layer includes the p-type oxide according to <1> or <2>.

<6> The semiconductor element according to <5>, wherein the semiconductor element is a diode, where the diode includes:
a first electrode;
a second electrode; and
the active layer formed between the first electrode and the second electrode.

<7> The semiconductor element according to <5>, wherein the semiconductor element is a field-effect transistor, where the field-effect transistor includes:
a gate electrode configured to apply gate voltage;
a source electrode and a drain electrode both configured to extract electric current;

the active layer formed between the source electrode and the drain electrode; and a gate insulating layer formed between the gate electrode and the active layer, <8> A display element, comprising:

a light control element whose light output is controlled corresponding to a driving signal; and a driving circuit, which includes the semiconductor element according to <5>, and which is configured to drive the light control element.

<9> The display element according to <8>, wherein the light control element includes an organic electroluminescent element, an electrochromic element, a liquid crystal element, an electrophoretic element, or an electrowetting element.

<10> An image display device, which displays an image corresponding to image data, the image display device including;

a plurality of the display elements each according to <8>, which are arranged in a matrix;

a plurality of lines configured to separately apply gate voltage and signal voltage to each field-effect transistor in each of the display elements; and a display control device configured to individually control the gate voltage and the signal voltage of each field-effect transistor through the lines, corresponding to the image data.

<11> A system, including:

the image display device as according to <10>; and an image data forming device configured to form the image data based upon image information to be displayed, and output the image data to the image display device.

REFERENCE SIGNS LIST

2: cathode
3: n-type semiconductor layer
4: p-type semiconductor layer
5: anode
6: pn-junction diode
10: field-effect transistor
20: field-effect transistor
22: active layer
23: source electrode
24: drain electrode
25: gate insulating layer
26: gate electrode
40: field-effect transistor
302, 302': display element
310: display
320, 320': driving circuit
370: liquid crystal element
400: display control device

The invention claimed is:

1. A p-type amorphous oxide compound without a Cu-metal, comprising:
an oxide,
wherein the oxide consists of:
Cu; and
an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
wherein the p-type amorphous oxide compound is without unoxidized Cu alloy or elemental Cu metal.

2. The p-type amorphous oxide compound according to claim 1, wherein the element M comprises Sb, or Sn, or both thereof.

3. A composition for producing a p-type amorphous oxide compound without a Cu-metal, comprising:
a solvent;
a Cu-containing compound; and
an element M-containing compound, where the element M is selected from p-block elements, and can be in an equilibrium state as being present as an ion, wherein the equilibrium state is a state in which there are both a state where all of electrons of p-orbital of an outermost shell are lost, and a state where all of electrons of an outermost shell are lost,
wherein the composition for producing a p-type amorphous oxide compound is used for production of a p-type amorphous oxide compound,
wherein the p-type amorphous oxide compound comprises:
an oxide, and
wherein the oxide consists of:
Cu; and
the element M, and
wherein the p-type amorphous oxide compound is without unoxidized Cu alloy or elemental Cu metal.

4. A method for producing a p-type amorphous oxide compound without a Cu-metal, the method comprising:
applying a composition on a support; and
performing a heat treatment after the applying,
wherein the composition comprises:
a solvent;
a Cu-containing compound; and
an element M-containing compound, where the element M is selected from p-block elements, and can be in an equilibrium state as being present as an ion, wherein the equilibrium state is a state in which there are both a state where all of electrons of p-orbital of an outermost shell are lost, and a state where all of electrons of an outermost shell are lost,
wherein the p-type amorphous oxide compound comprises:
an oxide, and
wherein the oxide consists of:
Cu; and
the element, and
wherein the p-type amorphous oxide compound is without unoxidized Cu alloy or elemental Cu metal.

5. A semiconductor element, comprising:
an active layer,
wherein the active layer comprises a p-type amorphous oxide compound without a Cu-metal,
wherein the p-type amorphous oxide compound comprises:
an oxide,
wherein the oxide consists of:
Cu; and
an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
wherein the p-type amorphous oxide compound is without unoxidized Cu alloy or elemental Cu metal.

6. The semiconductor element according to claim 5, wherein the semiconductor element is a diode, where the diode comprises:
   a first electrode;
   a second electrode; and
   the active layer formed between the first electrode and the second electrode.

7. The semiconductor element according to claim 5, wherein the semiconductor element is a field-effect transistor, where the field-effect transistor comprises:
   a gate electrode configured to apply gate voltage;
   a source electrode and a drain electrode both configured to extract electric current;
   the active layer formed between the source electrode and the drain electrode; and
   a gate insulating layer formed between the gate electrode and the active layer.

8. A display element, comprising:
   a light control element whose light output is controlled corresponding to a driving signal; and
   a driving circuit, which comprises a semiconductor element, and which is configured to drive the light control element,
   wherein the semiconductor element comprises:
      an active layer,
   wherein the active layer comprises:
      a p-type amorphous oxide compound without a Cu-metal,
   wherein the p-type amorphous oxide compound comprises:
      an oxide,
   wherein the oxide consists of:
      Cu; and
      an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
   wherein the p-type amorphous oxide compound is without unoxidized Cu alloy or elemental Cu metal.

9. The display element according to claim 8, wherein the light control element comprises an organic electroluminescent element, an electrochromic element, a liquid crystal element, an electrophoretic element, or an electrowetting element.

10. An image display device, which displays an image corresponding to image data, the image display device comprising:
   a plurality of display elements, which are arranged in a matrix;
   a plurality of lines configured to separately apply gate voltage and signal voltage to each field-effect transistor in each of the display elements; and
   a display control device configured to individually control the gate voltage and the signal voltage of each field-effect transistor through the lines, corresponding to the image data,
   wherein each of the display elements comprises:
      a light control element whose light output is controlled corresponding to a driving signal; and
      a driving circuit, which comprises a semiconductor element, and which is configured to drive the light control element,
   wherein the semiconductor element comprises:
      an active layer,
   wherein the active layer comprises:
      a p-type amorphous oxide compound without a Cu-metal,
   wherein the p-type amorphous oxide compound comprises:
      an oxide,
   wherein the oxide consists of:
      Cu; and
      an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
   wherein the p-type amorphous oxide compound is without unoxidized Cu alloy or elemental Cu metal.

11. A system, comprising:
   an image display device; and
   an image data forming device configured to form the image data based upon image information to be displayed, and output the image data to the image display device,
   wherein the image display device comprises:
      a plurality of display elements, which are arranged in a matrix;
      a plurality of lines configured to separately apply gate voltage and signal voltage to each field-effect transistor in each of the display elements; and
      a display control device configured to individually control the gate voltage and the signal voltage of each field-effect transistor through the lines, corresponding to the image data,
   wherein each of the display elements comprises:
      a light control element whose light output is controlled corresponding to a driving signal; and
      a driving circuit, which comprises a semiconductor element, and which is configured to drive the light control element,
   wherein the semiconductor element comprises:
      an active layer,
   wherein the active layer comprises:
      a p-type amorphous oxide compound without a Cu-metal,
   wherein the p-type amorphous oxide compound comprises:
      an oxide,
   wherein the oxide consists of:
      Cu; and
      an element M, which is selected from p-block elements, and which can be in an equilibrium state, as being present as an ion, wherein the equilibrium state is a state in which there are both a state where all of electrons of p-orbital of an outermost shell are lost, and a state where all of electrons of an outermost shell are lost, and
   wherein the p-type amorphous oxide compound is without unoxidized Cu alloy or elemental Cu metal.

* * * * *